(12) United States Patent
Guler et al.

(10) Patent No.: US 11,355,608 B2
(45) Date of Patent: Jun. 7, 2022

(54) SELF-ALIGNED GATE ENDCAP (SAGE) ARCHITECTURES WITH GATE-ALL-AROUND DEVICES HAVING EPITAXIAL SOURCE OR DRAIN STRUCTURES

(71) Applicant: Intel Corporation, Santa Clara, CA (US)

(72) Inventors: Leonard P. Guler, Hillsboro, OR (US); Biswajeet Guha, Hillsboro, OR (US); Tahir Ghani, Portland, OR (US); Swaminathan Sivakumar, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 745 days.

(21) Appl. No.: 16/139,252

(22) Filed: Sep. 24, 2018

(65) Prior Publication Data

US 2020/0098878 A1    Mar. 26, 2020

(51) Int. Cl.
*H01L 29/76*     (2006.01)
*H01L 29/94*     (2006.01)
(Continued)

(52) U.S. Cl.
CPC .............. *H01L 29/42356* (2013.01); *H01L 21/823418* (2013.01); *H01L 21/823431* (2013.01); *H01L 21/823437* (2013.01); *H01L 27/0886* (2013.01); *H01L 29/0649* (2013.01); *H01L 29/0673* (2013.01); *H01L 29/6656* (2013.01); *H01L 29/66545* (2013.01)

(58) Field of Classification Search
CPC ....... H01L 29/42356; H01L 21/823418; H01L 21/823431; H01L 21/823437; H01L 27/0886; H01L 29/0649; H01L 29/0673; H01L 29/66545; H01L 29/6656; H01L 29/0692; H01L 29/42376; H01L 29/66439; H01L 29/775; H01L 21/823412; H01L 21/823481; H01L 29/78696; H01L 29/42392; B82Y 10/00
USPC ........................................................ 257/401
See application file for complete search history.

(56) References Cited

U.S. PATENT DOCUMENTS

2016/0322501 A1\* 11/2016 Cheng ................ H01L 21/0243
2019/0363026 A1\* 11/2019 Lee .................. H01L 21/823885

\* cited by examiner

*Primary Examiner* — Theresa T Doan
(74) *Attorney, Agent, or Firm* — Schwabe, Williamson & Wyatt, P.C.

(57) ABSTRACT

Self-aligned gate endcap architectures with gate-all-around devices having epitaxial source or drain structures are described. For example, a structure includes first and second vertical arrangements of nanowires, the nanowires of the second vertical arrangement of nanowires having a horizontal width greater than a horizontal width of the nanowires of the first vertical arrangement of nanowires. First and second gate stacks are over the first and second vertical arrangements of nanowires, respectively. A gate endcap isolation structure is between the first and second gate stacks, respectively. First epitaxial source or drain structures are at ends of the first vertical arrangement of nanowires and have an uppermost surface below an uppermost surface of the gate endcap isolation structure. Second epitaxial source or drain structures are at ends of the second vertical arrangement of nanowires and have an uppermost surface below the uppermost surface of the gate endcap isolation structure.

15 Claims, 13 Drawing Sheets

(51) Int. Cl.
*H01L 31/113* (2006.01)
*H01L 29/423* (2006.01)
*H01L 29/66* (2006.01)
*H01L 29/06* (2006.01)
*H01L 27/088* (2006.01)
*H01L 21/8234* (2006.01)

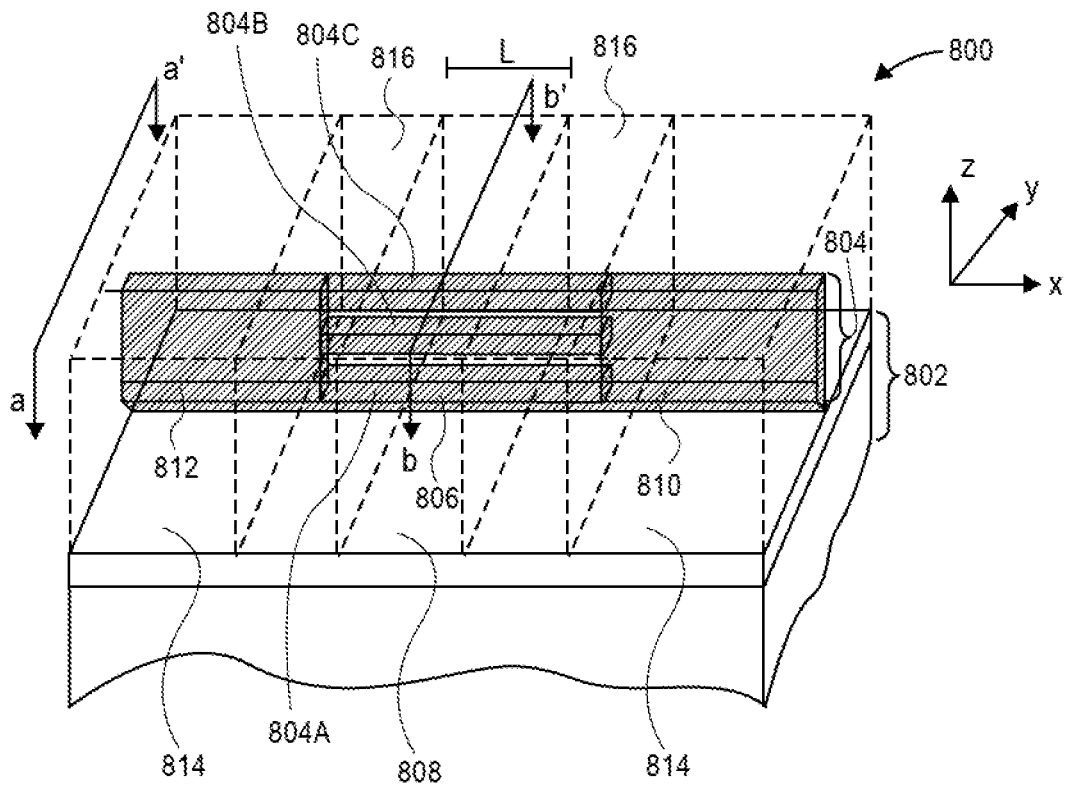
FIG. 8A
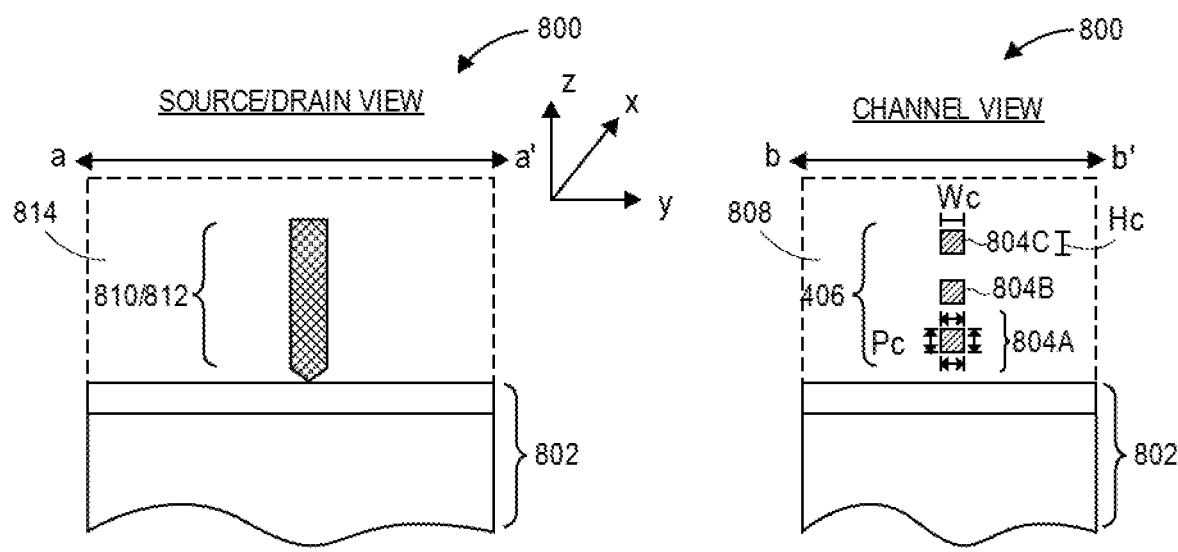
FIG. 8B  FIG. 8C

SELF-ALIGNED GATE ENDCAP (SAGE) ARCHITECTURES WITH GATE-ALL-AROUND DEVICES HAVING EPITAXIAL SOURCE OR DRAIN STRUCTURES

TECHNICAL FIELD

Embodiments of the disclosure are in the field of integrated circuit structures and processing and, in particular, self-aligned gate endcap (SAGE) architectures with gate-all-around devices having epitaxial source or drain structures, and methods of fabricating self-aligned gate endcap (SAGE) architectures with gate-all-around devices having epitaxial source or drain structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

BRIEF DESCRIPTION OF THE DRAWINGS

FIG. 8A illustrates a three-dimensional cross-sectional view of a nanowire-based integrated circuit structure, in accordance with an embodiment of the present disclosure.

FIG. 8B illustrates a cross-sectional source or drain view of the nanowire-based integrated circuit structure of FIG. 8A, as taken along the a-a' axis, in accordance with an embodiment of the present disclosure.

FIG. 8C illustrates a cross-sectional channel view of the nanowire-based integrated circuit structure of FIG. 8A, as taken along the b-b' axis, in accordance with an embodiment of the present disclosure.

DESCRIPTION OF THE EMBODIMENTS

Figure 1:
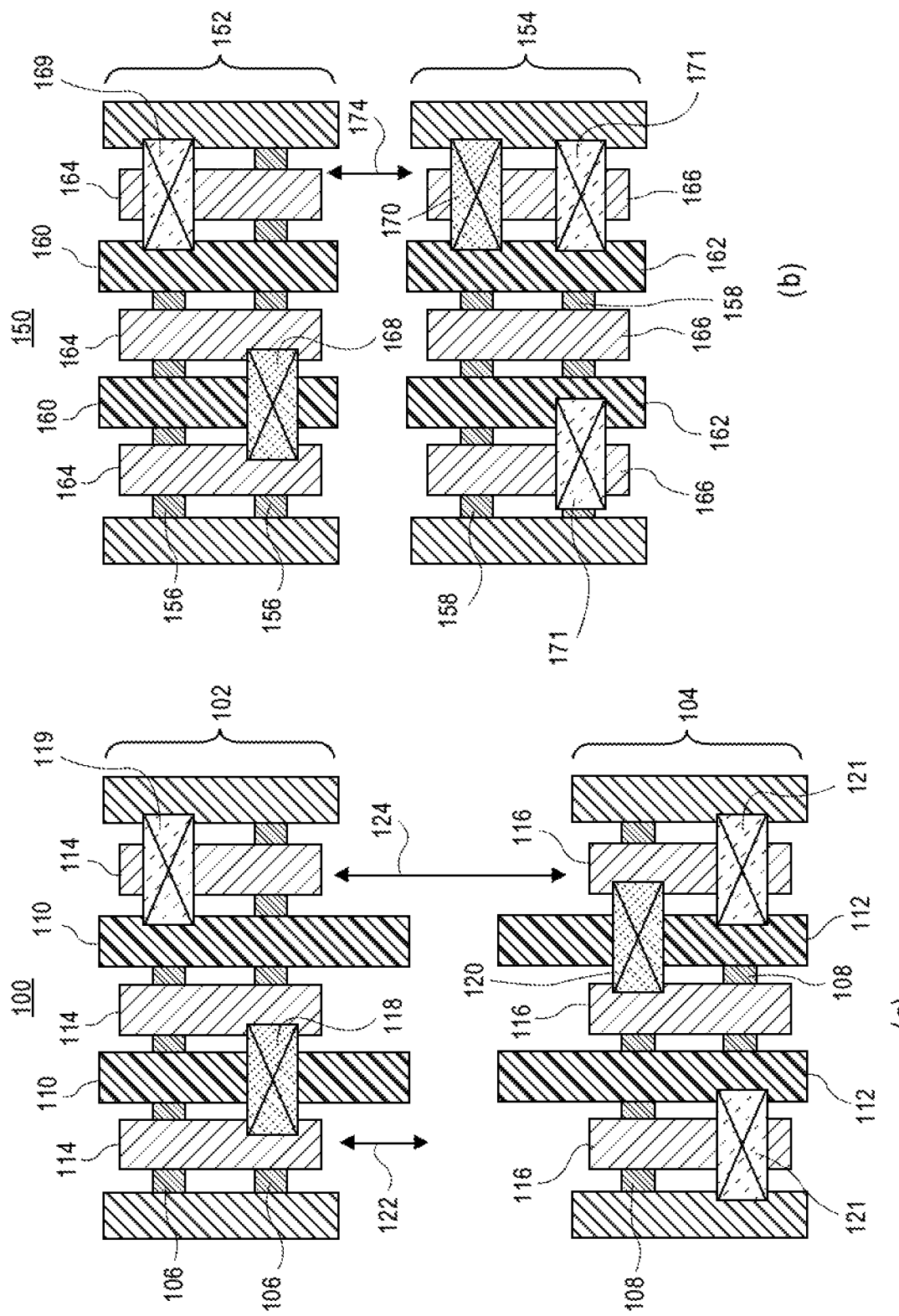
FIG. 1 illustrates plan views of adjacent integrated circuit structures for a conventional architecture with relatively wide spacing (left-hand side (a)) versus adjacent integrated circuit structures for a self-aligned gate endcap (SAGE) architecture with relatively tight spacing (right-hand side (b)), in accordance with an embodiment of the present disclosure.

Self-aligned gate endcap (SAGE) architectures with gate-all-around devices having epitaxial source or drain structures, and methods of fabricating self-aligned gate endcap (SAGE) architectures with gate-all-around devices having epitaxial source or drain structures, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments of the present disclosure are directed to integrated circuit structures, semiconductor structures or devices having one or more gate endcap structures (e.g., as gate isolation regions) of gate electrodes of the integrated circuit structures, semiconductor structures or devices. Additionally, methods of fabricating gate endcap isolation structures in a self-aligned manner are also described. In one or more embodiments, self-aligned gate endcap structures are fabricated with gate-all-around features. Embodiments described herein may address issues associated with scaling diffusion end-to-end spacing in an ultra-scaled process technology.

Particular embodiments may be directed to integration of multiple width (multi-Wsi) nanowires and nanoribbons in a SAGE architecture. In an embodiment, nanowires/nanoribbons are integrated with multiple Wsi in a SAGE architecture based front end process flow. Such a process flow may involve integration of nanowires and nanoribbons of different Wsi to provide robust functionality of next generation transistors with low power and high performance.

To provide context, balancing non-uniform epitaxial growth across integrated circuit structures can be challenging. Embodiments described herein may address non uniform height of epitaxial growth associated with growing source or drain structures on silicon (Si) regions having variable surface area, e.g., having surface area differences nanoribbon/nanowire architectures. Epitaxial regions may be embedded (e.g., portions of nanowires removed and then source or drain (S/D) growth is performed) or formed by merging (e.g., epitaxial regions are formed around existing wires), as described in greater detail below in association with FIGS. 9A-9E.

In an exemplary process flow, a planarizing material is formed over structures having uneven epitaxial growth. A non-selective etch is used to recess both the planarizing material and the structures having uneven epitaxial growth. Another approach may involve overgrowth of epitaxial structures followed by polishing and recessing. Epitaxial structures between wires and ribbons can be ultimately be formed at a same level with one or both having a flat uppermost surface. Exemplary embodiments of processing schemes and resulting structures are described below in association with FIGS. 6A-6C, 7A and 7B.

To provide context, state-of-the-art approaches have relied on lithographic scaling of the gate end to end (poly cut) to define a minimum technology gate overlap of diffusion. The minimum technology gate overlap of diffusion is a key component in diffusion end to end space. An associated gate line (poly cut) process has typically been limited by lithography, registration, and etch bias considerations, and ultimately sets the minimum diffusion end to end distance. Other approaches such as contact over active gate (COAG) architectures have worked to improve such diffusion spacing capability. However, improvements in this technology arena remain highly sought after.

Advantages of a self-aligned gate endcap (SAGE) architecture over conventional approaches may include the enabling of higher layout density and, in particular, scaling of diffusion to diffusion spacing. As an example, FIG. 1 illustrates plan views of adjacent integrated circuit structures for a conventional architecture with relatively wide spacing (left-hand side (a)) versus adjacent integrated circuit structures for a SAGE architecture with relatively tight spacing (right-hand side (b)), in accordance with an embodiment of the present disclosure. FIG. 1 illustrates plan views of adjacent integrated circuit structures for a conventional architecture with relatively wide spacing (left-hand side (a)) versus adjacent integrated circuit structures for a self-aligned gate endcap (SAGE) architecture with relatively tight spacing (right-hand side (b)), in accordance with an embodiment of the present disclosure.

Referring to the left-hand side (a) of FIG. 1, a layout 100 includes first 102 and second 104 integrated circuit structures based on semiconductor fins and/or nanowires 106 and 108, respectively. Each device 102 and 104 has a gate electrode 110 or 112, respectively. Additionally, each device 102 and 104 has trench contacts (TCNs) 114 or 116, respectively, at source and drain regions of the fins 106 and 108, respectively. Gate vias 118 and 120, and trench contact vias 119 and 121 are also depicted.

Referring again to the left-hand side (a) of FIG. 1, the gate electrodes 110 and 112 have a relatively wide end cap region 122, which is located off of the corresponding fins 106 and 108, respectively. The TCNs 114 and 116 each have a relatively large end-to-end spacing 124, which is also located off of the corresponding fins 106 and 108, respectively.

By contrast, referring to the right-hand side (b) of FIG. 1, in an embodiment, a layout 150 includes first 152 and second 154 integrated circuit structures based on semiconductor fins and/or nanowires 156 and 158, respectively. Each device 152 and 154 has a gate electrode 160 or 162, respectively. Additionally, each device 152 and 154 has trench contacts (TCNs) 164 or 166, respectively, at source and drain regions of the fins 156 and 158, respectively. Gate vias 168 and 170, and trench contact vias 169 and 171 are also depicted.

Referring again to the right-hand side (b) of FIG. 1, the gate electrodes 160 and 162 have a relatively tight end cap region, which is located off of the corresponding fins 156 and 158, respectively. The TCNs 164 and 166 each have a relatively tight end-to-end spacing 174, which is also located off of the corresponding fins and/or nanowires 156 and 158, respectively.

To provide further context, scaling of gate endcap and trench contact (TCN) endcap regions are important contributors towards improving transistor layout area and density. Gate and TCN endcap regions refer to gate and TCN overlap of the diffusion region/fin/nanowire of integrated circuit structures. As an example, FIG. 2 illustrates a plan view of a conventional layout 200 including fin-based and/or nanowire-based integrated circuit structures accommodating end-to-end spacing.

Figure 2:
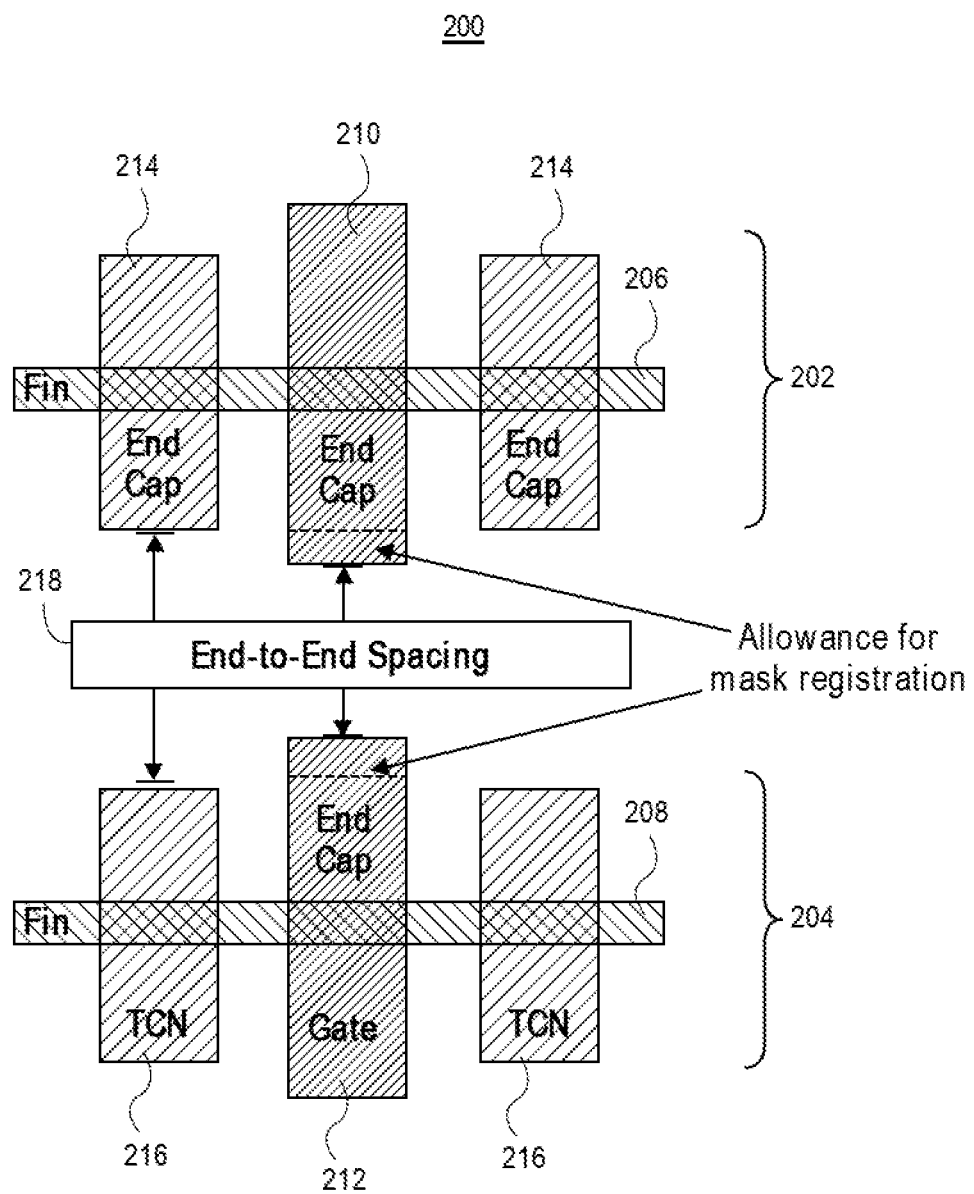
FIG. 2 illustrates a plan view of a conventional layout including fin-based and/or nanowire-based integrated circuit structures accommodating end-to-end spacing.

Referring to FIG. 2, first 202 and second 204 integrated circuit structures are based on semiconductor fins and/or nanowires 206 and 208, respectively. Each device 202 and 204 has a gate electrode 210 or 212, respectively. Additionally, each device 202 and 204 has trench contacts (TCNs) 214 or 216, respectively, at source and drain regions of the fins and/or nanowires 206 and 208, respectively. The gate electrodes 210 and 212 and the TCNs 214 and 216 each have an end cap region, which is located off of the corresponding fins and/or nanowires 206 and 208, respectively.

Referring again to FIG. 2, typically, gate and TCN endcap dimensions must include an allowance for mask registration error to ensure robust transistor operation for worst case mask mis-registration, leaving an end-to-end spacing 218. Thus, another important design rule critical to improving transistor layout density is the spacing between two adjacent endcaps facing each other. However, the parameters of "2*Endcap+End-to-End Spacing" are becoming increasingly difficult to scale using lithographic patterning to meet the scaling requirements for new technologies. In particular, the additional endcap length required to allow for mask registration error also increases gate capacitance values due to longer overlap length between TCN and gate electrodes, thereby increasing product dynamic energy consumption and degrading performance. Previous solutions have focused on improving registration budget and patterning or resolution improvements to enable shrinkage of both endcap dimension and endcap-to-endcap spacing.

In accordance with an embodiment of the present disclosure, approaches are described which provide for self-aligned gate endcap and TCN overlap of a semiconductor fin and/or nanowire without any need to allow for mask registration. In one such embodiment, a disposable spacer is fabricated on the semiconductor fin sidewalls which determines the gate endcap and the contact overlap dimensions. The spacer defined endcap process enables the gate and TCN endcap regions to be self-aligned to the semiconductor fin and, therefore, does not require extra endcap length to account for mask mis-registration. Furthermore, approaches described herein do not necessarily require lithographic patterning at previously required stages since the gate and TCN endcap/overlap dimensions remain fixed, leading to improvement (i.e., reduction) in device to device variability in electrical parameters.

In accordance with one or more embodiments of the present disclosure, scaling is achieved through a reduction of gate endcap overlap to diffusion by constructing a SAGE wall. As an example, FIG. 3 illustrates cross-sectional views taken through nanowires and fins for a conventional architecture (left-hand side (a)) versus a self-aligned gate endcap (SAGE) architecture (right-hand side (b)), in accordance with an embodiment of the present disclosure.

Figure 3:
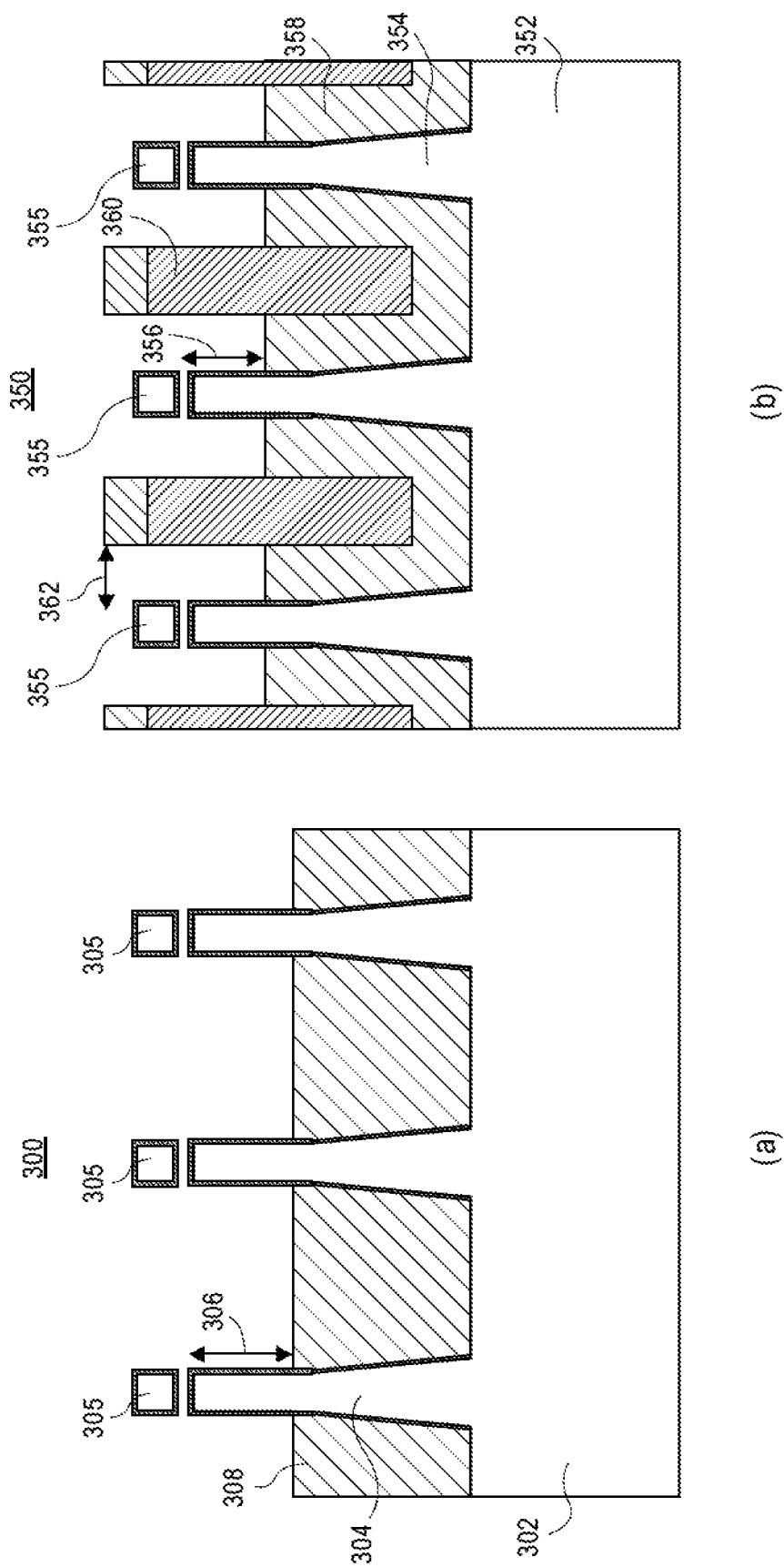
FIG. 3 illustrates cross-sectional views taken through nanowires and fins for a conventional architecture (left-hand side (a)) versus a self-aligned gate endcap (SAGE) architecture (right-hand side (b)), in accordance with an embodiment of the present disclosure.

Referring to the left-hand side (a) of FIG. 3, an integrated circuit structure 300 includes a substrate 302 having fins 304 protruding therefrom by an amount 306 above an isolation structure 308 laterally surrounding lower portions of the fins 304. Corresponding nanowires 305 are over the fins 304. A gate structure may be formed over the integrated circuit structure 300 to fabricate a device. However, breaks in such a gate structure are accommodated for by increasing the spacing between fin 304/nanowire 305 pairs.

By contrast, referring to the right-hand side (b) of FIG. 3, an integrated circuit structure 350 includes a substrate 352 having fins 354 protruding therefrom by an amount 356 above an isolation structure 358 laterally surrounding lower portions of the fins 304. Corresponding nanowires 305 are over the fins 304. Isolating SAGE walls 360 (which may include a hardmask thereon, as depicted) are included within the isolation structure 352 and between adjacent fin 354/nanowire 355 pairs. The distance between an isolating SAGE wall 360 and a nearest fin 354/nanowire 355 pair defines the gate endcap spacing 362. A gate structure may be formed over the integrated circuit structure 300, between insolating SAGE walls to fabricate a device. Breaks in such a gate structure are imposed by the isolating SAGE walls. Since the isolating SAGE walls 360 are self-aligned, restrictions from conventional approaches can be minimized to enable more aggressive diffusion to diffusion spacing. Furthermore, since gate structures include breaks at all locations, individual gate structure portions may be layer connected by local interconnects formed over the isolating SAGE walls 360. In an embodiment, as depicted, the SAGE walls 360 each include a lower dielectric portion and a dielectric cap on the lower dielectric portion.

In accordance with one or more embodiments of the present disclosure, a self-aligned gate endcap (SAGE) processing scheme involves the formation of gate/trench contact endcaps self-aligned to fins without requiring an extra length to account for mask mis-registration. Thus, embodiments may be implemented to enable shrinking of transistor layout area. Embodiments described herein may involve the fabrication of gate endcap isolation structures, which may also be referred to as gate walls, isolation gate walls or self-aligned gate endcap (SAGE) walls.

In an embodiment, a SAGE architecture is implemented by fabricating a SAGE isolation structure after a process of cutting the fins to remove fin portions in select locations. In another embodiment, SAGE wall formation is performed prior to the finalization of fin geometries. For comparative purposes, FIG. 4 illustrates cross-sectional views and corresponding plan views of integrated circuit structures fabricated (a) without a SAGE isolation structure, (b) with a SAGE isolation structure fabricated after a fin cut process, and (c) with a SAGE isolation structure fabricated before a fin cut process, in accordance with an embodiment of the present disclosure.

Figure 4:
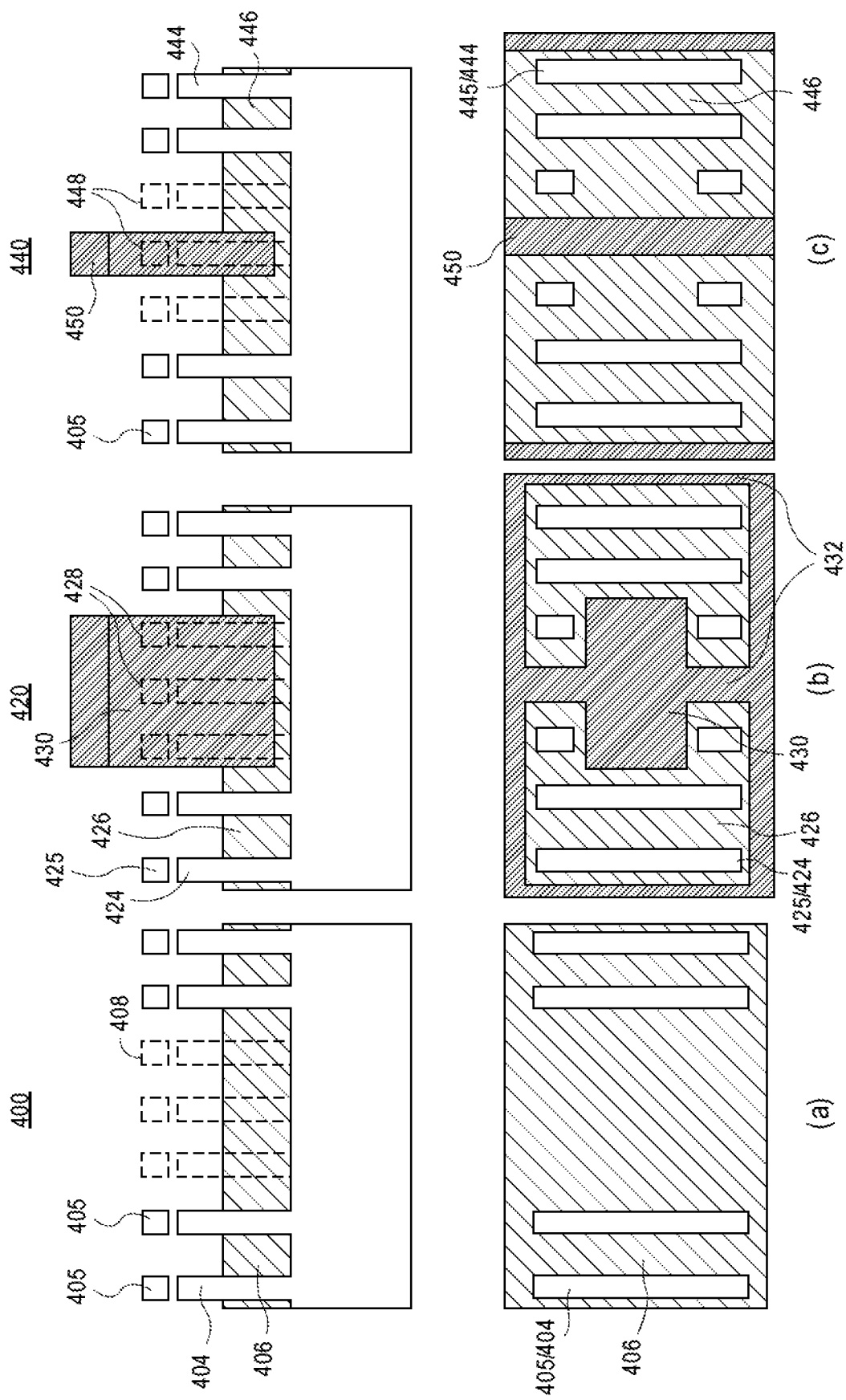
FIG. 4 illustrates cross-sectional views and corresponding plan views of integrated circuit structures fabricated (a) without a SAGE isolation structure, (b) with a SAGE isolation structure fabricated after a fin cut process, and (c) with a SAGE isolation structure fabricated before a fin cut process, in accordance with an embodiment of the present disclosure.

Referring to part (a) of FIG. 4, an integrated circuit structure 400 fabricated without a SAGE isolation structure includes a substrate having a plurality of fin/nanowire pairs 404/405 protruding therefrom. An isolation structure 406 laterally surrounds lower portions of the fins of the fin/nanowire pairs 404/405. Locations 408 indicate regions where fins or portions of fins have been removed, e.g., by a masking and etch process. A process sequence for fabricating integrated circuit structure 400 may include (i) providing a silicon substrate, (ii) hardmask formation and patterning on the silicon substrate, (iii) silicon fin patterning by etching the silicon substrate in the presence of the hardmask, (iv) fin cutting by further mask and etch processing, and (v) shallow trench isolation (STI) fill, polish and recess to form isolation structure 406.

Referring to part (b) of FIG. 4, an integrated circuit structure 420 fabricated by forming a SAGE isolation structure after a fin cut process, which is referred to herein as a bi-directional SAGE architecture, includes a substrate having a plurality of fin/nanowire pairs 424/425 protruding therefrom. An isolation structure 426 laterally surrounds lower portions of the fins of the fin/nanowire pairs 424/425. Locations 428 indicate regions where fin/nanowire pairs or portions of fin/nanowire pairs are removed, e.g., by a masking and etch process. A SAGE wall 430 (which may include a hardmask as indicated by the horizontal line) is formed in locations 428 and has extension portions 432 extending from the SAGE wall 430. A process sequence for fabricating integrated circuit structure 420 may include (i) providing a silicon substrate, (ii) SAGE stack formation, (iii) fin/nanowire precursor patterning, (iv) fin/nanowire precursor cutting by further mask and etch processing, (v) SAGE endcap/wall fabrication, (vi) shallow trench isolation (STI) fill, polish and recess to form isolation structure 426, and (vii) release of nanowire(s).

Referring to part (c) of FIG. 4, an integrated circuit structure 440 fabricated by forming a SAGE isolation structure prior to a fin cut process, which is referred to herein as a unidirectional SAGE architecture, includes a substrate having a plurality of fin/nanowire pairs 444/445 protruding therefrom. An isolation structure 446 laterally surrounds lower portions of the fins of the fin/nanowire pairs 444/445. Locations 448 indicate regions where fin/nanowire pairs or portions of fin/nanowire pairs are removed or are not formed. A SAGE wall 450 (which may include a hardmask as indicated by the horizontal line) is formed in a narrow region of location 428. In contrast, to the SAGE wall 430 of part (b) of FIG. 4, the SAGE wall 450 has a same width adjacent non-cut fin/nanowire pair portions as the width adjacent a fin/nanowire pair cut portion. A process sequence for fabricating integrated circuit structure 440 may include (i) providing a silicon substrate, (ii) SAGE stack formation, (iii) fin/nanowire precursor patterning, (iv) SAGE endcap/wall fabrication, (v) fin/nanowire precursor cutting by further mask and etch processing, (vi) shallow trench isolation (STI) fill, polish and recess to form isolation structure 446, and (vii) release of nanowire(s).

Referring to integrated structure 440, as compared to integrated circuit structure 420, by relocating the wall formation prior to fin/nanowire precursor cuts, the SAGE wall can be restricted to running along the fin direction only. Referring to the plan view (lower portion) of part (c) of FIG. 4, in accordance with an embodiment of the present disclosure, an integrated circuit structure includes a first semiconductor fin/nanowire pair (fin/nanowire pair 444/445 to immediate left of 450) having a cut along a length of the first semiconductor fin/nanowire pair. A second semiconductor fin/nanowire pair (fin/nanowire pair 444/445 to immediate right of 450) has a cut along a length of the second semiconductor fin/nanowire pair. A gate endcap isolation structure 450 is between the first semiconductor fin/nanowire pair and the second semiconductor fin/nanowire pair. The gate endcap isolation structure 450 has a substantially uniform width along the lengths of the first and second semiconductor fin/nanowire pairs.

Figure 5:
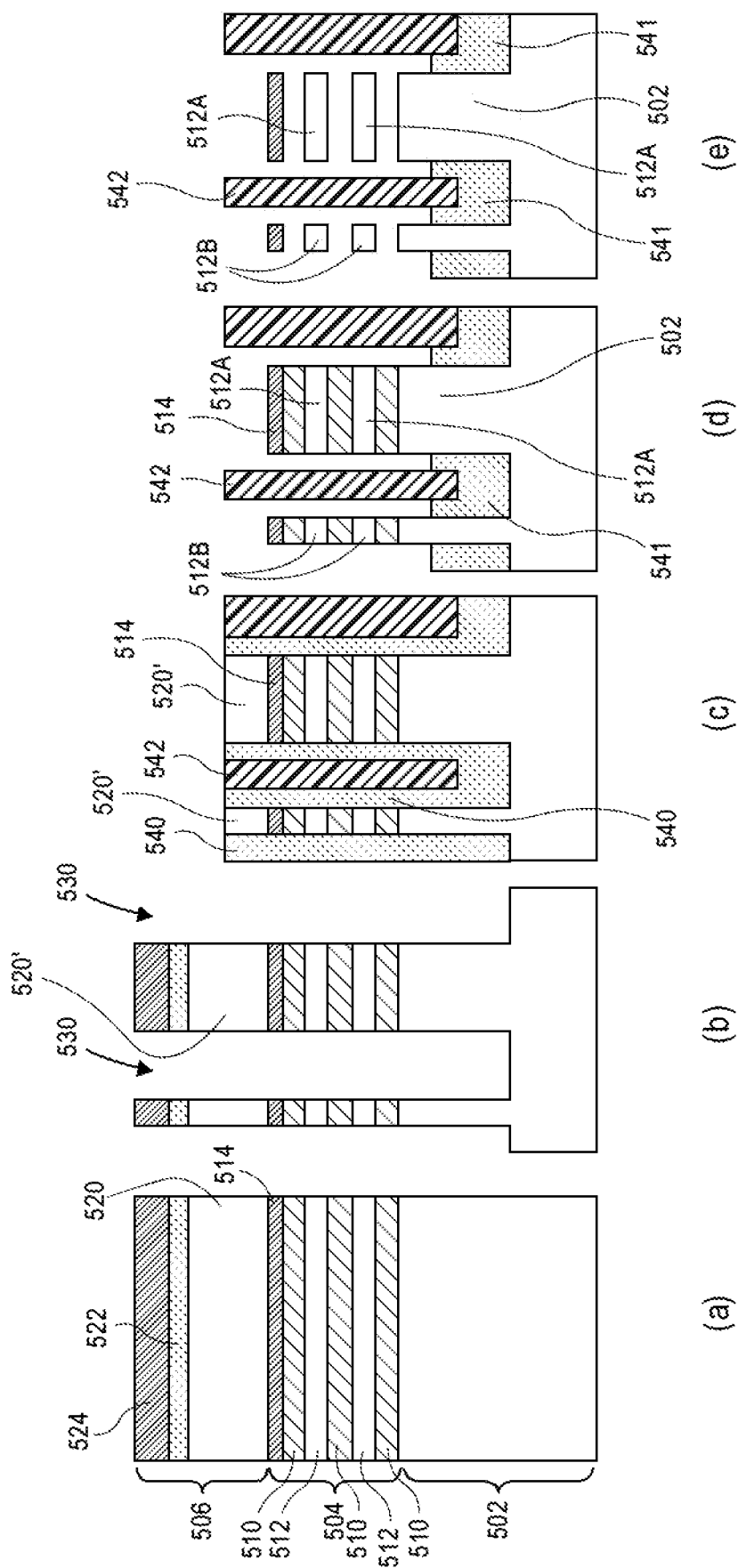
FIG. 5 illustrates cross-sectional views representing various operations in a method of fabricating a self-aligned gate endcap (SAGE) structure with gate-all-around devices, in accordance with an embodiment of the present disclosure.

In an exemplary processing scheme, FIG. 5 illustrate cross-sectional views representing various operations in a method of fabricating a self-aligned gate endcap (SAGE) structure with gate-all-around devices, in accordance with an embodiment of the present disclosure.

Referring to part (a) of FIG. 5, a starting structure includes a nanowire patterning stack 504 above a substrate 502. A lithographic patterning stack 506 is formed above the nanowire patterning stack 504. The nanowire patterning stack 504 includes alternating silicon germanium layers 510 and silicon layers 512. A protective mask 514 is between the nanowire patterning stack 504 and the lithographic patterning stack 506. In one embodiment, the lithographic patterning stack 506 is trilayer mask composed of a topographic masking portion 520, an anti-reflective coating (ARC) layer 522, and a photoresist layer 524. In a particular such embodiment, the topographic masking portion 520 is a carbon hardmask (CHM) layer and the anti-reflective coating layer 522 is a silicon ARC layer.

Referring to part (b) of FIG. 5, the stack of part (a) is lithographically patterned and then etched to provide an etched structure including a patterned substrate 502 and trenches 530.

Referring to part (c) of FIG. 5, the structure of part (b) has an isolation layer 540 and a SAGE material 542 formed in trenches 530. The structure is then planarized to leave patterned topographic masking layer 520' as an exposed upper layer.

Referring to part (d) of FIG. 5, the isolation layer 540 is recessed below an upper surface of the patterned substrate 502, e.g., to define a protruding fin portion and to provide a trench isolation structure 541 beneath SAGE walls 542.

Referring to part (e) of FIG. 5, the silicon germanium layers 510 are removed at least in the channel region to release silicon nanowires 512A and 512B. Subsequent to the formation of the structure of part (e) of FIG. 5, a gate stacks may be formed around nanowires 512B or 512A, over protruding fins of substrate 502, and between SAGE walls 542. In one embodiment, prior to formation of the gate stacks, the remaining portion of protective mask 514 is removed. In another embodiment, the remaining portion of protective mask 514 is retained as an insulating fin hat as an artifact of the processing scheme.

Referring again to part (e) of FIG. 5, it is to be appreciated that a channel view is depicted, with source or drain regions being locating into and out of the page. In an embodiment, the channel region including nanowires 512B has a width less than the channel region including nanowires 512A. Thus, in an embodiment, an integrated circuit structure includes multiple width (multi-Wsi) nanowires. Although structures of 512B and 512A may be differentiated as nanowires and nanoribbons, respectively, both such structures are typically referred to herein as nanowires. It is also to be appreciated that reference to or depiction of a fin/ nanowire pair throughout may refer to a structure including a fin and one or more overlying nanowires (e.g., two overlying nanowires are shown in FIG. 5).

Figure 6A:
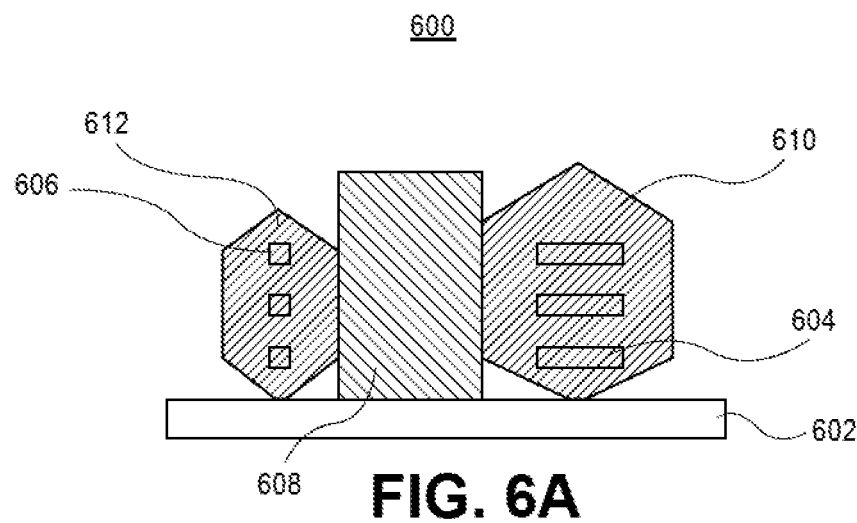
FIGS. 6A-6C illustrate cross-sectional views representing various operations in a method of fabricating a self-aligned gate endcap (SAGE) structure with gate-all-around devices having epitaxial source or drain structures, in accordance with an embodiment of the present disclosure.
Figure 6B:
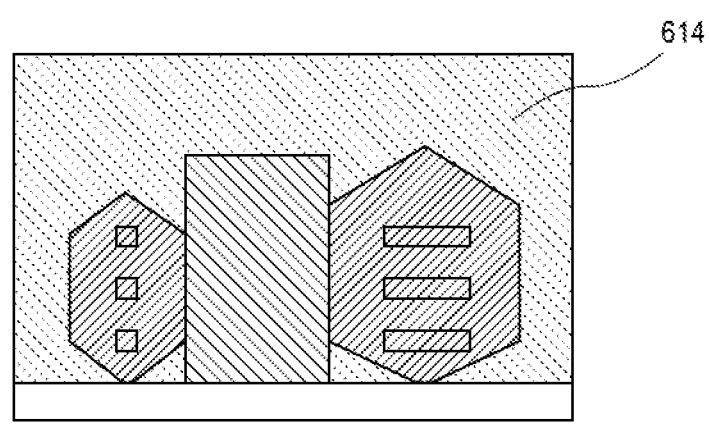
Figure 6C:
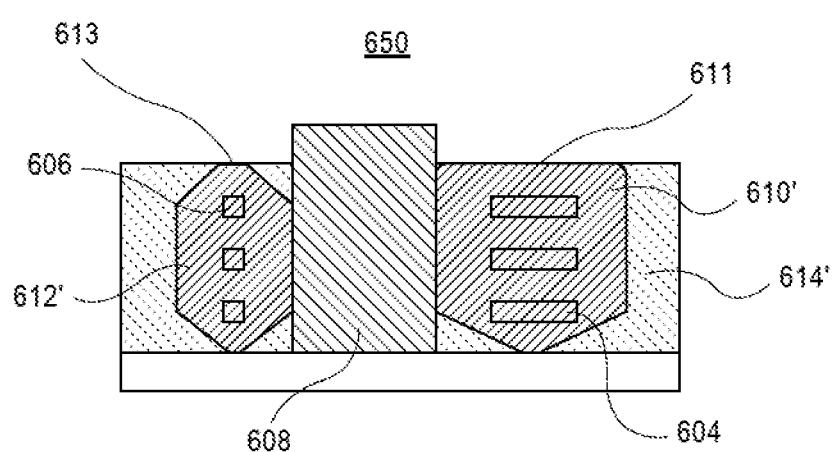
Figure 7A:
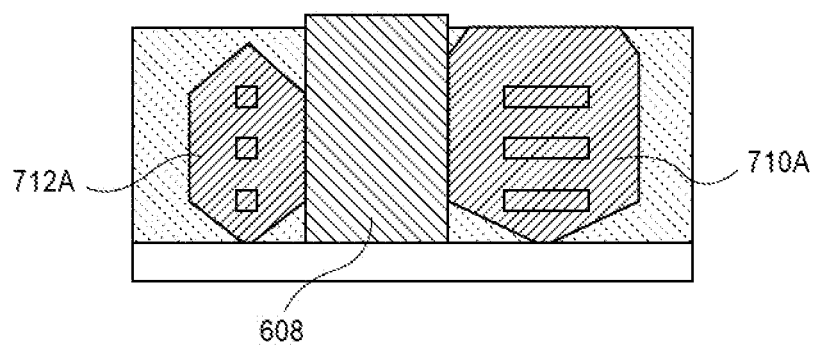
FIG. 7A illustrates a cross-sectional view of fabricating another self-aligned gate endcap (SAGE) structure with gate-all-around devices having epitaxial source or drain structures, in accordance with another embodiment of the present disclosure.
Figure 7B:
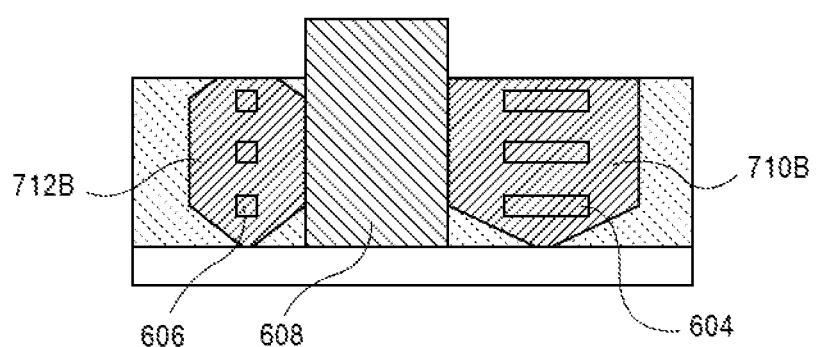
FIG. 7B illustrates a cross-sectional view of fabricating another self-aligned gate endcap (SAGE) structure with gate-all-around devices having epitaxial source or drain structures, in accordance with another embodiment of the present disclosure.

In an exemplary process flow, a planarizing material is formed over structures having uneven epitaxial growth and a non-selective etch is used to recess the planarizing material and the structures having uneven epitaxial growth. For example, FIGS. 6A-6C illustrate cross-sectional views representing various operations in a method of fabricating a self-aligned gate endcap (SAGE) structure with gate-all-around devices having epitaxial source or drain structures, in accordance with an embodiment of the present disclosure. FIG. 7A illustrates a cross-sectional view of fabricating another self-aligned gate endcap (SAGE) structure with gate-all-around devices having epitaxial source or drain structures, in accordance with another embodiment of the present disclosure. FIG. 7B illustrates a cross-sectional view of fabricating another self-aligned gate endcap (SAGE) structure with gate-all-around devices having epitaxial source or drain structures, in accordance with another embodiment of the present disclosure.

Referring to FIG. 6A, a method of fabricating an integrated circuit structure 600 includes forming a first vertical arrangement of nanowires 606 and a second vertical arrangement of nanowires 604 above a substrate 602. The nanowires of the second vertical arrangement of nanowires 604 have a horizontal width greater than a horizontal width of the nanowires of the first vertical arrangement of nanowires 606 (e.g., nanowires 606 may be referred to as nanowires, and nanowires 604 may be referred to as nanoribbons). A gate endcap isolation structure 608 is formed between the first vertical arrangement of nanowires 606 and the second vertical arrangement of nanowires 604. First epitaxial source or drain structures 612 are formed at ends of the first vertical arrangement of nanowires 606 (only one end depicted in FIG. 6A). Second epitaxial source or drain structures 610 are formed at ends of the second vertical arrangement of nanowires 604 (only one end depicted in FIG. 6A).

In an embodiment, the second epitaxial source or drain structures 610 have an uppermost surface above the uppermost surface of the gate endcap isolation structure 608, as is depicted in FIG. 6A. In one such embodiment, the first epitaxial source or drain structures 612 have an uppermost surface below the uppermost surface of the gate endcap isolation structure 608, as is also depicted in FIG. 6A. In an embodiment, the first vertical arrangement of nanowires 606 is over a first fin, and the second vertical arrangement of nanowires 604 is over a second fin, as exemplified in FIG. 5.

Referring to FIG. 6B, a planarizing material 614 is formed over the structure 600 of FIG. 6A. In one embodiment, the planarizing material 614 is a carbon hardmask material deposited by atomic layer deposition (ALD) or chemical vapor deposition (CVD) and then subjected to a chemical mechanical planarization process. In another embodiment, the planarizing material 614 is a flowable silicon oxide based material. In an embodiment, planarizing material 614 is flowable material and can be used to fill a narrow narrow trench. In some embodiment, the deposition leads to a relatively flat surface and, hence, an actual "planarization" operation may be optional. It is to be appreciated that a carbon hardmask may be used as a flowable material, however, a flowable oxide can also be used as well.

Referring to FIG. 6C, the uppermost surface of the second epitaxial source or drain structures 610 are recessed below the uppermost surface of the gate endcap isolation structure 608 to form integrated circuit structure 650 having recessed second epitaxial source or drain structures 610' and recessed planarizing material 614'. In an embodiment, the recessing is performed using an etch process that is not selective between the planarizing material 614 and the second epitaxial source or drain structures 610. The recessed planarizing material 614' may subsequently be removed to enable contact formation. In an embodiment, in the case that a selective etch is performed, a masking or inter-layer dielectric material is first recessed to prior to a pre-epitaxial etch in order to recess masking or inter-layer dielectric material separately.

Referring again to FIG. 6C, in an embodiment, as depicted, the recessing further involves recessing an uppermost surface of the first epitaxial source or drain structures 612 to form recessed first epitaxial source or drain structures 612'. Referring to FIG. 7A, in another embodiment, recessing an uppermost surface of a second epitaxial source or drain structures to form recessed second epitaxial source or drain structures 710A does not involve recessing an uppermost surface of first epitaxial source or drain structures 712A to form an integrated circuit structure 700. In an embodiment, uppermost surface of second epitaxial source or drain structures are recessed from a point of the second epitaxial source or drain structures to an uppermost flat surface, as is depicted in the transition from FIG. 6B to FIG. 6C, 7A or 7B. In an embodiment, the uppermost surface of the second epitaxial source or drain structures 610 are recessed below the uppermost surface of the gate endcap isolation structure 608 to inhibit shorting of devices due to conductive or semiconducting structures protruding above the gate endcap isolation structure 608.

Referring again to FIG. 6C, 7A or 7B, in accordance with an embodiment of the present disclosure, an integrated circuit structure 650, 700 or 750 includes a first vertical arrangement of nanowires 606 and a second vertical arrangement of nanowires 604 above a substrate 602. The nanowires of the second vertical arrangement of nanowires 604 have a horizontal width greater than a horizontal width of the nanowires of the first vertical arrangement of nanowires 606. Although not depicted in the view of FIG. 6C, 7A or 7B, but as exemplified in other embodiments described herein, a first gate stack is over the first vertical arrangement of nanowires, and a second gate stack is over the second vertical arrangement of nanowires. A gate endcap isolation structure 608 is between and in contact with the first gate stack and the second gate stack. First epitaxial source or drain structures 612', 712A or 712B are at ends of the first vertical arrangement of nanowires 606.

In an embodiment, the first epitaxial source or drain structures 612', 712A or 712B have an uppermost surface below an uppermost surface of the gate endcap isolation structure 608. Second epitaxial source or drain structures 610', 710A or 710B are at ends of the second vertical arrangement of nanowires 604, the second epitaxial source or drain structures 612', 712A or 712B have an uppermost surface below the uppermost surface of the gate endcap isolation structure 608. In an embodiment, first epitaxial source or drain structures 612', 712A or 712B and second epitaxial source or drain structures 610', 710A or 710B are symmetrical in the horizontal direction in the perspective taken in FIGS. 6C, 7A and 7B, as is depicted.

In an embodiment, the uppermost surface of the first epitaxial source or drain structures 612' or 712B is a first flat surface (e.g., surface 613), and the uppermost surface of the second epitaxial source or drain structures 610' or 710B is a second flat surface (e.g., surface 611). In one such embodiment, the first flat surface 613 of the first epitaxial source or drain structures 612' is narrower than a widest width of the first epitaxial source or drain structures 612', and the second flat surface 611 of the second epitaxial source or drain structures 610' is narrower than a widest width of the second epitaxial source or drain structures 610', as is depicted in FIG. 6C in which a portion of the upper taper of the structure 610 remains. In another such embodiment, the first flat surface of the first epitaxial source or drain structures 712B is narrower than a widest width of the first epitaxial source or drain structures 712B, and the second flat surface of the second epitaxial source or drain structures 710B is as wide as a widest width of the second epitaxial source or drain structures 710B, as is depicted in FIG. 7B.

In another embodiment, the uppermost surface of the first epitaxial source or drain structures 712A is a point, and the uppermost surface of the second epitaxial source or drain structures 710A is a flat surface, as is depicted in FIG. 7A. In one such embodiment, the flat surface of the second epitaxial source or drain structures 710A is narrower than a widest width of the second epitaxial source or drain structures 710A, as is also depicted in FIG. 7A.

Referring again to FIG. 6C, 7A or 7B, in accordance with an embodiment of the present disclosure, a bottom portion of the first epitaxial source or drain structures is tapered, and a bottom portion of the second epitaxial source or drain structures is tapered. In an embodiment, the first and second epitaxial source or drain structures are non-discrete first and second epitaxial source or drain structures, as depicted in FIGS. 6B, 7A and 7B, and as described in greater detail below. In another embodiment, the first and second epitaxial source or drain structures are discrete first and second epitaxial source or drain structures.

To highlight an exemplary integrated circuit structure having three vertically arranged nanowires, FIG. 8A illustrates a three-dimensional cross-sectional view of a nanowire-based integrated circuit structure, in accordance with an embodiment of the present disclosure. FIG. 8B illustrates a cross-sectional source or drain view of the nanowire-based integrated circuit structure of FIG. 8A, as taken along the a-a' axis. FIG. 8C illustrates a cross-sectional channel view of the nanowire-based integrated circuit structure of FIG. 8A, as taken along the b-b' axis.

Referring to FIG. 8A, an integrated circuit structure 800 includes one or more vertically stacked nanowires (804 set) above a substrate 802. An optional fin between the bottommost nanowire and the substrate 802 is not depicted for the sake of emphasizing the nanowire portion for illustrative purposes. Embodiments herein are targeted at both single wire devices and multiple wire devices. As an example, a three nanowire-based devices having nanowires 804A, 804B and 804C is shown for illustrative purposes. For convenience of description, nanowire 804A is used as an example where description is focused on one of the nanowires. It is to be appreciated that where attributes of one nanowire are described, embodiments based on a plurality of nanowires may have the same or essentially the same attributes for each of the nanowires.

Each of the nanowires 804 includes a channel region 806 in the nanowire. The channel region 806 has a length (L). Referring to FIG. 8C, the channel region also has a perimeter (Pc) orthogonal to the length (L). Referring to both FIGS. 8A and 8C, a gate electrode stack 808 surrounds the entire perimeter (Pc) of each of the channel regions 806. The gate electrode stack 808 includes a gate electrode along with a gate dielectric layer between the channel region 806 and the gate electrode (not shown). In an embodiment, the channel region is discrete in that it is completely surrounded by the gate electrode stack 808 without any intervening material such as underlying substrate material or overlying channel fabrication materials. Accordingly, in embodiments having a plurality of nanowires 804, the channel regions 806 of the nanowires are also discrete relative to one another.

Referring to both FIGS. 8A and 8B, integrated circuit structure 800 includes a pair of non-discrete source or drain regions 810/812. The pair of non-discrete source or drain regions 810/812 is on either side of the channel regions 806 of the plurality of vertically stacked nanowires 804. Furthermore, the pair of non-discrete source or drain regions 810/812 is adjoining for the channel regions 806 of the plurality of vertically stacked nanowires 804. In one such embodiment, not depicted, the pair of non-discrete source or drain regions 810/812 is directly adjoining for the channel regions 806 in that epitaxial growth is on and between nanowire portions extending beyond the channel regions 806 (as exemplified in FIGS. 6C, 7A and 7B), where nanowire ends are shown within the source or drain structures. In another embodiment, as depicted in FIG. 8A, the pair of non-discrete source or drain regions 810/812 is indirectly adjoining for the channel regions 806 in that they are formed at the ends of the nanowires and note between the nanowires.

In an embodiment, as depicted, the source or drain regions 810/812 are non-discrete in that there are not individual and discrete source or drain regions for each channel region 806 of a nanowire 804. Accordingly, in embodiments having a plurality of nanowires 804, the source or drain regions 810/812 of the nanowires are global or unified source or drain regions as opposed to discrete for each nanowire. In one embodiment, from a cross-sectional perspective orthogonal to the length of the discrete channel regions 806, each of the pair of non-discrete source or drain regions 810/812 is approximately rectangular in shape with a bottom tapered portion, as depicted in FIG. 8B. In other embodiments, however, the source or drain regions 810/812 of the nanowires are relatively larger yet discrete non-merged epitaxial structures.

In accordance with an embodiment of the present disclosure, and as depicted in FIGS. 8A and 8B, integrated circuit structure 800 further includes a pair of contacts 814, each contact 814 on one of the pair of non-discrete source or drain regions 810/812. In one such embodiment, in a vertical sense, each contact 814 completely surrounds the respective non-discrete source or drain region 810/812. In another aspect, the entire perimeter of the non-discrete source or drain regions 810/812 may not be accessible for contact with contacts 814, and the contact 814 thus only partially surrounds the non-discrete source or drain regions 810/812, as depicted in FIG. 8B. In a contrasting embodiment, not depicted, the entire perimeter of the non-discrete source or drain regions 810/812, as taken along the a-a' axis, is surrounded by the contacts 814.

Referring to FIGS. 8B and 8C, the non-discrete source or drain regions 810/812 are global in the sense that a single unified feature is used as a source or drain region for a plurality (in this case, 3) of nanowires 804 and, more particularly, for more than one discrete channel region 806. In an embodiment, the pair of non-discrete source or drain regions 810/812 is composed of a semiconductor material different than the semiconductor material of the discrete channel regions 806, e.g., the pair of non-discrete source or drain regions 810/812 is composed of a silicon germanium while the discrete channel regions 806 are composed of silicon. In another embodiment, the pair of non-discrete source or drain regions 810/812 is composed of a semiconductor material the same or essentially the same as the semiconductor material of the discrete channel regions 806, e.g., both the pair of non-discrete source or drain regions 810/812 and the discrete channel regions 806 are composed of silicon.

Referring again to FIG. 8A, in an embodiment, integrated circuit structure 800 further includes a pair of spacers 816. As is depicted, outer portions of the pair of spacers 816 may overlap portions of the non-discrete source or drain regions 810/812, providing for "embedded" portions of the non-discrete source or drain regions 810/812 beneath the pair of spacers 816. As is also depicted, the embedded portions of the non-discrete source or drain regions 810/812 may not extend beneath the entirety of the pair of spacers 816.

Substrate 802 may be composed of a material suitable for integrated circuit structure fabrication. In one embodiment, substrate 802 includes a lower bulk substrate composed of a single crystal of a material which may include, but is not limited to, silicon, germanium, silicon-germanium or a III-V compound semiconductor material. An upper insulator layer composed of a material which may include, but is not limited to, silicon dioxide, silicon nitride or silicon oxynitride is on the lower bulk substrate. Thus, the structure 800 may be fabricated from a starting semiconductor-on-insulator substrate. Alternatively, the structure 800 is formed directly from a bulk substrate and local oxidation is used to form electrically insulative portions in place of the above described upper insulator layer. In another alternative embodiment, the structure 800 is formed directly from a bulk substrate and doping is used to form electrically isolated active regions, such as nanowires, thereon. In one such embodiment, the first nanowire (i.e., proximate the substrate) is in the form of an omega-FET type structure.

In an embodiment, the nanowires 804 may be sized as wires or ribbons, as described below, and may have squared-off or rounder corners. In an embodiment, the nanowires 804 are composed of a material such as, but not limited to, silicon, germanium, or a combination thereof. In one such embodiment, the nanowires are single-crystalline. For example, for a silicon nanowire 804, a single-crystalline nanowire may be based from a (100) global orientation, e.g., with a <100> plane in the z-direction. As described below, other orientations may also be considered. In an embodiment, the dimensions of the nanowires 804, from a cross-sectional perspective, are on the nano-scale. For example, in a specific embodiment, the smallest dimension of the nanowires 804 is less than approximately 20 nanometers. In an embodiment, the nanowires 804 are composed of a strained material, particularly in the channel regions 806.

Referring to FIG. 8C, in an embodiment, each of the channel regions 806 has a width (Wc) and a height (Hc), the width (Wc) approximately the same as the height (Hc). That is, in both cases, the channel regions 806 are square-like or, if corner-rounded, circle-like in cross-section profile. In another aspect, the width and height of the channel region need not be the same, such as the case for nanoribbons as described throughout.

In another aspect, methods of fabricating a nanowire portion of a fin/nanowire integrated circuit structure are provided. For example, FIGS. 9A-9E illustrate three-dimensional cross-sectional views representing various operations in a method of fabricating a nanowire portion of a fin/nanowire structure, in accordance with an embodiment of the present disclosure. It is to be appreciated that, for clarity, SAGE wall processing is not depicted in association with FIGS. 9A-9E.

Figure 9A:
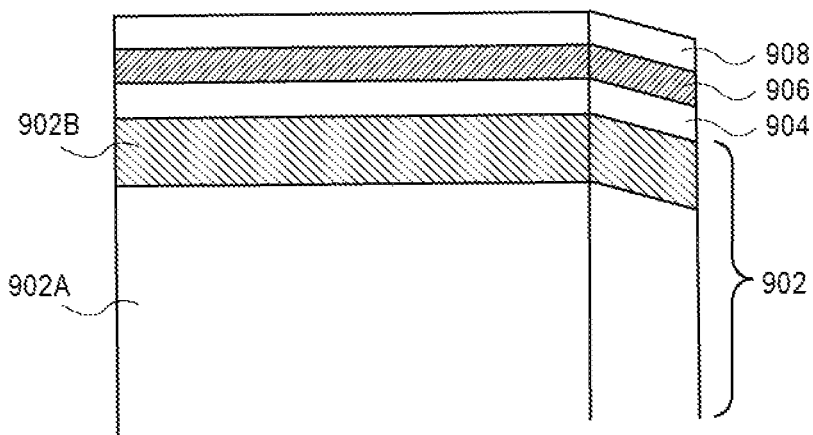
FIGS. 9A-9E illustrate three-dimensional cross-sectional views representing various operations in a method of fabricating a nanowire portion of a fin/nanowire structure, in accordance with an embodiment of the present disclosure.

A method of fabricating a nanowire integrated circuit structure may include forming a nanowire above a substrate. In a specific example showing the formation of two silicon nanowires, FIG. 9A illustrates a substrate 902 (e.g., composed of a bulk substrate silicon substrate 902A with an insulating silicon dioxide layer 902B there on) having a silicon layer 904/silicon germanium layer 906/silicon layer 908 stack thereon. It is to be understood that, in another embodiment, a silicon germanium layer/silicon layer/silicon germanium layer stack may be used to ultimately form two silicon germanium nanowires.

Figure 9B:
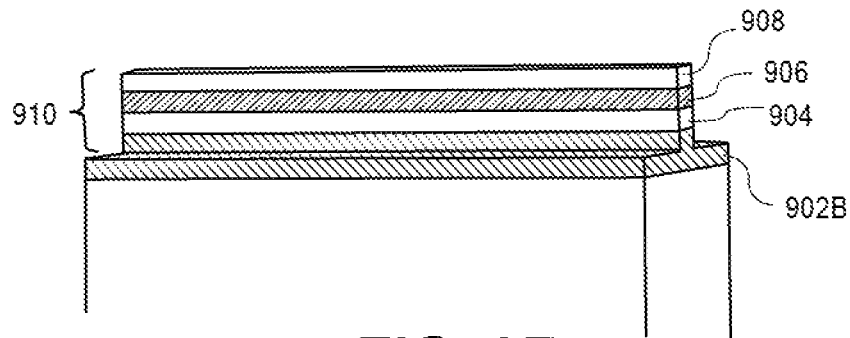

Referring to FIG. 9B, a portion of the silicon layer 904/silicon germanium layer 906/silicon layer 908 stack as well as a top portion of the silicon dioxide layer 902B is patterned into a fin-type structure 910, e.g., with a mask and plasma etch process. It is to be appreciated that, for illustrative purposes, the etch for FIG. 9B is shown as forming two silicon nanowire precursor portions. Although the etch is shown for ease of illustration as ending within a bottom isolation layer, more complex stacks are contemplated within the context of embodiments of the present disclosure. For example, the process may be applied to a nanowire/fin stack as described in association with FIG. 5.

Figure 9C:
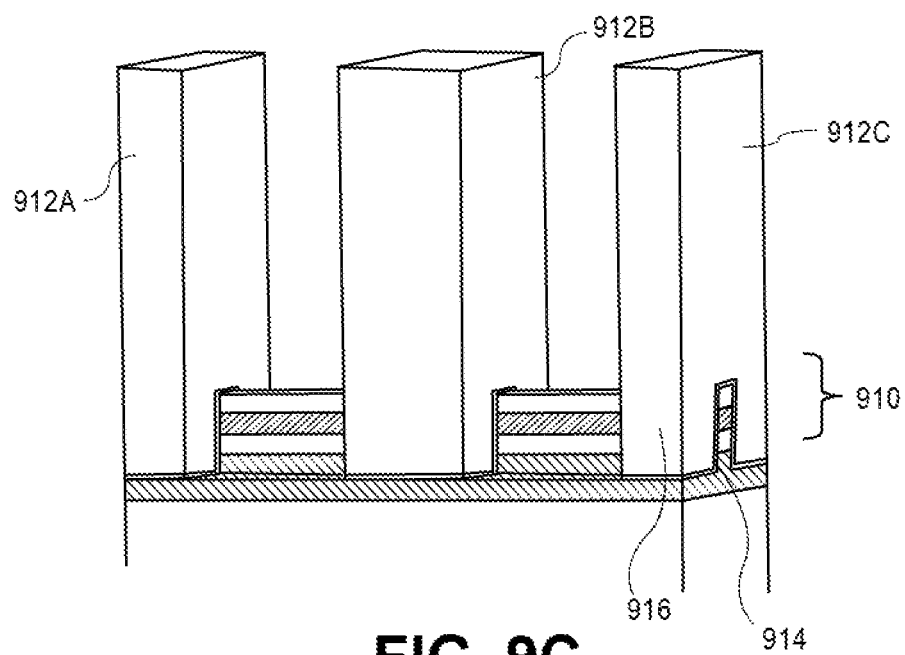

The method may also include forming a channel region in the nanowire, the channel region having a length and a perimeter orthogonal to the length. In a specific example showing the formation of three gate structures over the two silicon nanowires, FIG. 9C illustrates the fin-type structure 910 with three sacrificial gates 912A, 912B, and 912C thereon. In one such embodiment, the three sacrificial gates 912A, 912B, and 912C are composed of a sacrificial gate oxide layer 914 and a sacrificial polysilicon gate layer 916 which are blanket deposited and patterned with a plasma etch process.

Figure 9D:
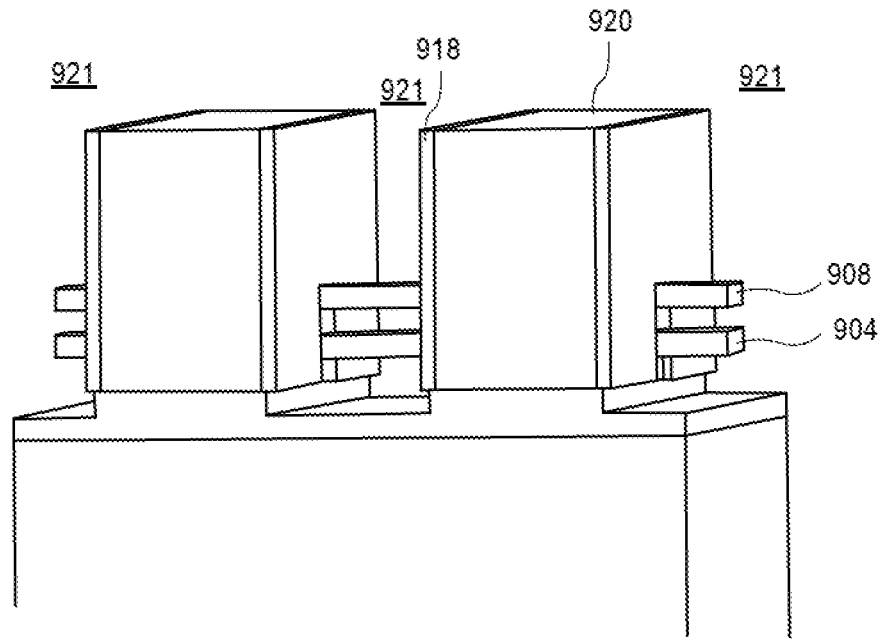

Following patterning to form the three sacrificial gates 912A, 912B, and 912C, spacers may be formed on the sidewalls of the three sacrificial gates 912A, 912B, and 912C, doping may be performed (e.g., tip and/or source and drain type doping), and an interlayer dielectric layer may be formed to cover the three sacrificial gates 912A, 912B, and 912C. The interlayer dielectric layer may be polished to expose the three sacrificial gates 912A, 912B, and 912C for a replacement gate, or gate-last, process. Referring to FIG. 9D, the three sacrificial gates 912A, 912B, and 912C have been removed, leaving spacers 918 and a portion of the interlayer dielectric layer 920 remaining.

Additionally, referring again to FIG. 9D the portions of the silicon germanium layer 906 and the portion of the insulating silicon dioxide layer 902B of the fin structure 910 are removed in the regions originally covered by the three sacrificial gates 912A, 912B, and 912C. Discrete portions of the silicon layers 904 and 908 thus remain, as depicted in FIG. 9D.

The discrete portions of the silicon layers 904 and 908 shown in FIG. 9D will, in one embodiment, ultimately become channel regions in a nanowire-based device. Thus, at the process stage depicted in FIG. 9D, channel engineering or tuning may be performed. For example, in one embodiment, the discrete portions of the silicon layers 904 and 908 shown in FIG. 9D are thinned using oxidation and etch processes. Such an etch process may be performed at the same time the wires are separated by etching the silicon germanium layer 906. Accordingly, the initial wires formed from silicon layers 904 and 908 begin thicker and are thinned to a size suitable for a channel region in a nanowire device, independent from the sizing of the source and drain regions of the device. Thus, in an embodiment, forming the channel region includes removing a portion of the nanowire, and the resulting perimeters of the source and drain regions (described below) are greater than the perimeter of the resulting channel region.

Figure 9E:
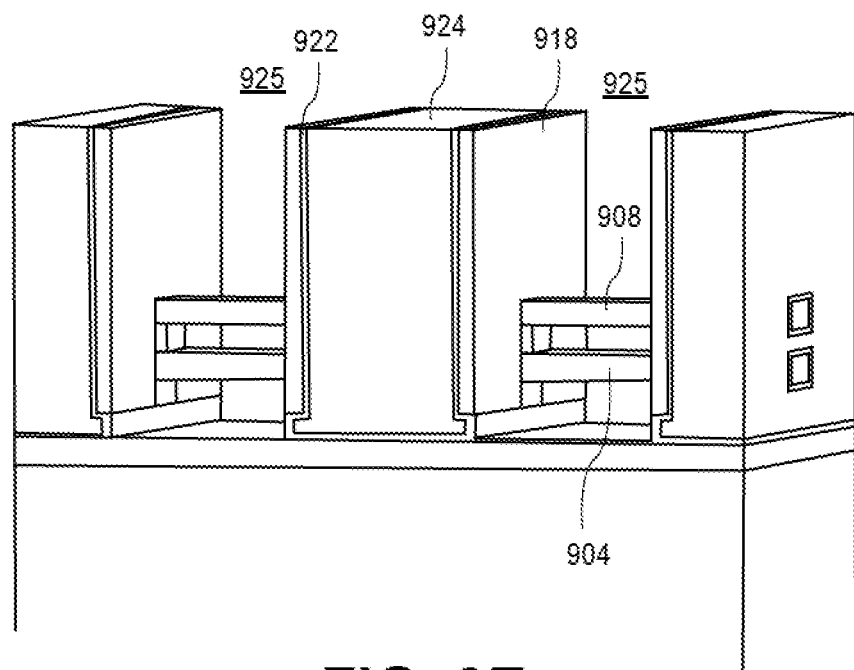

The method may also include forming a gate electrode stack surrounding the entire perimeter of the channel region. In the specific example showing the formation of three gate structures over the two silicon nanowires, FIG. 9E illustrates the structure following deposition of a gate dielectric layer 922 (such as a high-k gate dielectric layer) and a gate electrode layer 924 (such as a metal gate electrode layer), and subsequent polishing, in between the spacers 918. That is, gate structures are formed in the trenches 921 of FIG. 9D. Additionally, FIG. 9E depicts the result of the subsequent removal of the interlayer dielectric layer 920 after formation of the permanent gate stack. The portions of the silicon germanium layer 906 and the portion of the insulating silicon dioxide layer 902B of the fin structure 910 are also removed in the regions originally covered by the portion of the interlayer dielectric layer 920 depicted in FIG. 9D. Discrete portions of the silicon layers 904 and 908 thus remain, as depicted in FIG. 9E.

The method may also include forming a pair of source and drain regions in the nanowire, on either side of the channel region, each of the source and drain regions having a perimeter orthogonal to the length of the channel region. Specifically, the discrete portions of the silicon layers 904 and 908 shown in FIG. 9E will, in one embodiment, ultimately become at least a portion of the source and drain regions in a nanowire-based device. In one such embodiment, epitaxial source or drain structures are formed by merging epitaxial material around existing nanowires 904 and 908. In another embodiment, epitaxial source or drain structures are embedded, e.g., portions of nanowires 904 and 908 are removed and then source or drain (S/D) growth is performed. In either case, in accordance with an embodiment of the present disclosure, such epitaxial source or drain structures are recessed subsequent to epitaxial growth, as exemplified in association with FIGS. 6A-6C.

The method may subsequently include forming a pair of contacts, a first of the pair of contacts completely or nearly completely surrounding the perimeter of the source region, and a second of the pair of contacts completely or nearly completely surrounding the perimeter of the drain region. Specifically, contacts are formed in the trenches 925 of FIG. 9E following epitaxial growth and recess. In an embodiment, the contacts are formed from a metallic species. In one such embodiment, the metallic species is formed by conformally depositing a contact metal and then filling any remaining trench volume. The conformal aspect of the deposition may be performed by using chemical vapor deposition (CVD), atomic layer deposition (ALD), or metal reflow.

In another aspect, system-on-chip (SoC) process technologies typically require support of standard logic (e.g., low voltage, thin-oxide) and I/O (e.g., high voltage, thick-oxide) transistors. The distinction between standard logic and high voltage (HVI/O) devices may be accomplished through a multi-oxide process sequence, where logic transistors receive a thin, high-performance oxide and I/O devices receive a thick oxide capable to sustain higher voltages. As process technologies scale, the logic devices aggressively scale in dimension, creating fabrication challenges with dual-oxide formation. In accordance with one or more embodiments of the present disclosure, a high voltage/dual endcap process is used for fabrication of an ultra-scaled finfet transistor architecture.

To provide context, as technology nodes scale smaller, there is an increasing lack of geometrical space in a narrow-endcap logic device to accommodate a defect-free dual oxide process that may be needed for high-voltage transistor fabrication. Current approaches rely upon a single, unscaled endcap space to accommodate a single logic oxide process. However, such a process may be incompatible with highly scaled geometries supporting a dual-oxide high-voltage SoC technology, since the endcap space may be insufficient to accommodate both oxides (gate dielectrics).

In accordance with an embodiment of the present disclosure, scaling limitation imposed by requirements fill high-voltage gates with both the high-voltage oxide and logic oxide are addressed. In particular, as logic dimensions decrease, the endcap space in high voltage (HV) devices becomes insufficiently narrow to fill both oxides. In an embodiment, different endcap spaces between logic transistor and high-voltage transistor, respectively, are fabricated in a SAGE architecture prior to a fin cut process. The logic transistor endcap is ultra-scaled by using the self-aligned endcap architecture, while the high-voltage transistor has a wider endcap to accommodate a thicker gate dielectric. Both endcaps are unidirectional endcaps in that they are formed by to fin cut processing.

One or more embodiments described herein are directed to, or may be referred to as, a dual unidirectional endcap process flow for ultra-scaled logic endcap. To provide context, in a typical SAGE flow, a single endcap spacer is deposited to form a self-aligned endcap separating a fin from a SAGE wall. Embodiments described herein may involve formation of differential sacrificial spacer thickness between logic and HV gates. Subsequently, a self-aligned endcap wall is formed. The differential spacer widths are chosen to be thicker in the high voltage areas, and the standard thickness is used in the logic areas. The differential spacer widths may enable high-voltage oxide to be successfully deposited, without sacrificing density in the logic areas. In an embodiment, the thickness of the differential spacer is dependent on the intended HV oxide thickness.

Figure 10A:
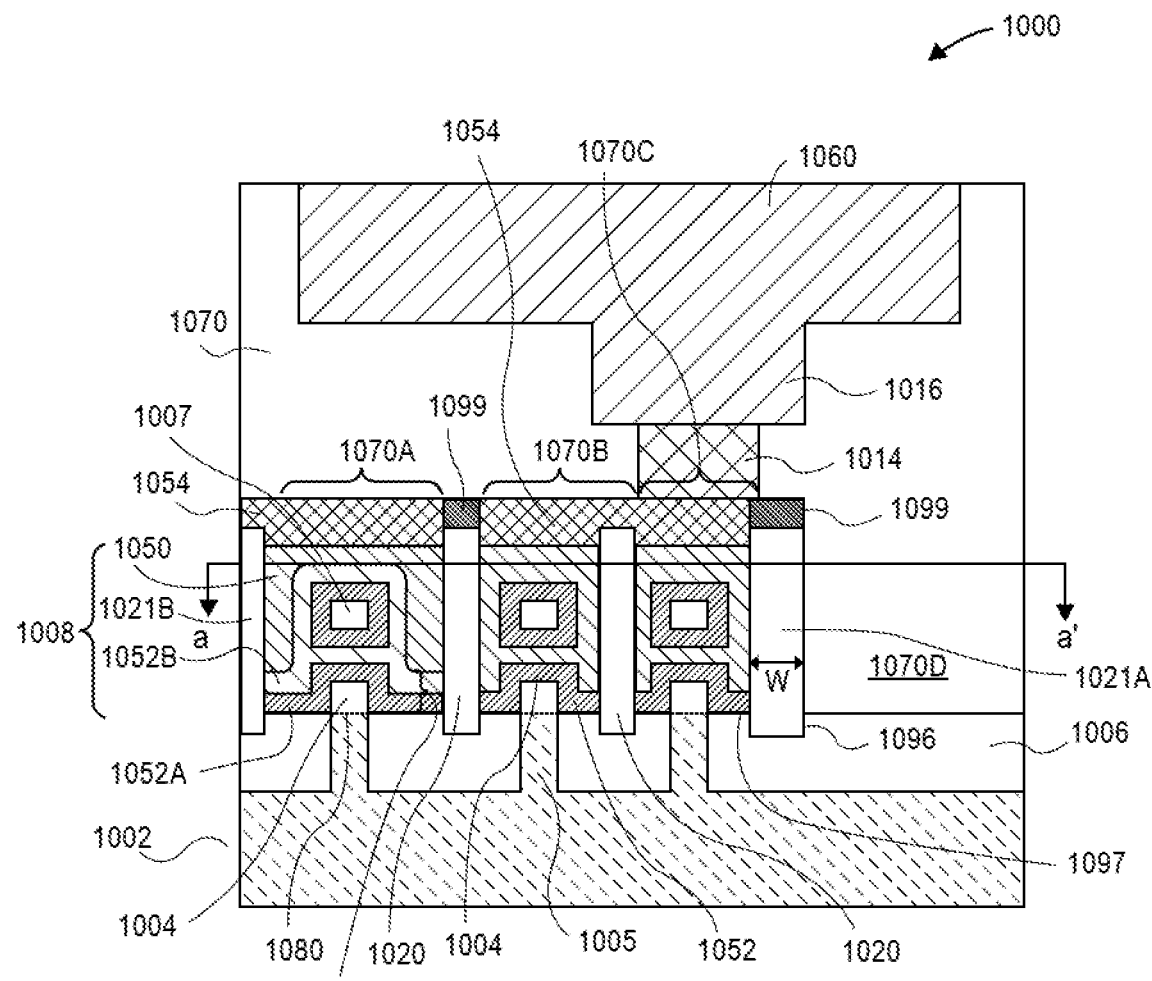
FIG. 10A illustrates a cross-sectional view of a nanowire-based integrated circuit structure having self-aligned gate endcap isolation, in accordance with an embodiment of the present disclosure.
Figure 10B:
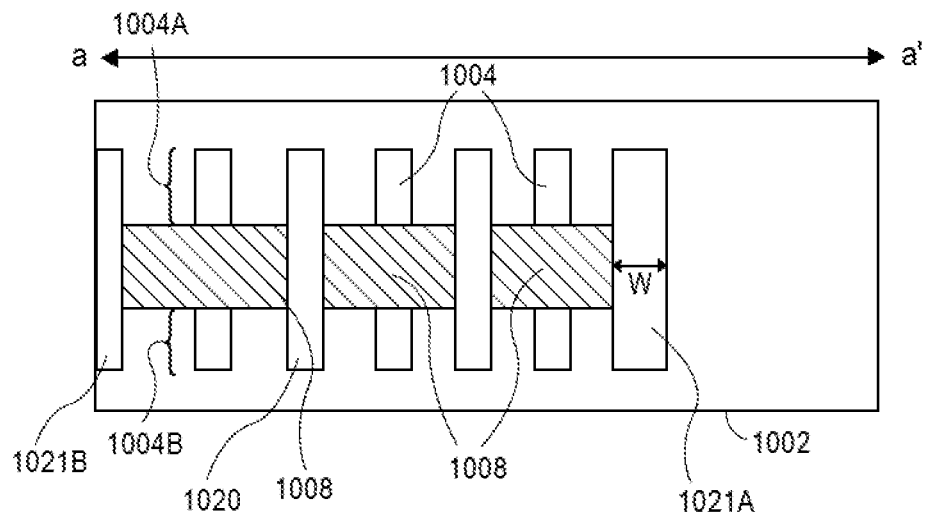
FIG. 10B illustrates a plan view taken along the a-a' axis of the integrated circuit structure of FIG. 10A, in accordance with an embodiment of the present disclosure.

As an example of completed devices, FIG. 10A illustrates a cross-sectional view of a nanowire-based integrated circuit structure having self-aligned gate endcap isolation, in accordance with an embodiment of the present disclosure. FIG. 10B illustrates a plan view taken along the a-a' axis of the integrated circuit structure of FIG. 10A, in accordance with an embodiment of the present disclosure.

Referring to FIG. 10A, an integrated circuit structure 1000 includes non-planar active regions, e.g., a protruding fin portion 1004 and one or more vertically overlying nanowires 1007. The protruding fin portions 1004 may be included in fin structures which further include a sub-fin region 1005 formed from substrate 1002, and within a trench isolation layer 1006. In an embodiment, the fin structures are a plurality of fin lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, grating-like fin patterns may have lines spaced at a constant pitch and having a constant width. The pattern may be fabricated by a pitch halving or pitch quartering, or other pitch division, approach. Each of the individual fins 1004 depicted may represent corresponding individual fins, or may represent a plurality of fins at a given location.

Gate structures 1008 are over the protruding portions 1004 of the non-planar active regions and around the one or more corresponding vertically overlying nanowires 1007, as well as over a portion of the trench isolation layer 1006. As shown, gate structures 1008 include a gate electrode 1050 and a gate dielectric layer 1052. In one embodiment, although not shown, gate structures 1008 may also include a dielectric cap layer.

Gate structures 1008 are separated by narrow self-aligned gate endcap (SAGE) isolation structures or walls 1020, 1021A or 1021B. The SAGE walls 1020 each have a width. In an embodiment, the SAGE wall 1021A has a width greater than the width of each of the SAGE walls 1020, and the SAGE wall 1021B has a width less than the width of each of the SAGE walls 1020. SAGE walls of differing width may be associated with different device types, as described in an exemplary embodiment below. Each SAGE wall 1020, 1021A or 1021B may include one or more of a local interconnect 1054 or a dielectric plug 1099 formed thereon. In an embodiment, each of the SAGE walls 1020, 1021A or 1021B is recessed below an uppermost surface 1097 of the trench isolation layer 1006, as is depicted in FIG. 10A.

In an exemplary embodiment, the integrated circuit structure 1000 includes a first plurality of semiconductor fin/nanowire pairs (fin/nanowire pair(s) 1004/1007 of region 1070A) above a substrate 1002 and protruding through an uppermost surface 1097 of a trench isolation layer 1006, and a first gate structure (gate structure 1008 of region 1070A) over the first plurality of semiconductor fin/nanowire pairs. A second plurality of semiconductor fin/nanowire pairs (fin/nanowire pair(s) 1004/1007 of region 1070B) is above the substrate 1002 and protrudes through the uppermost surface 1097 of the trench isolation layer 1006, and a second gate structure (gate structure 1008 of region 1070B) is over the second plurality of semiconductor fin/nanowire pairs. A gate endcap isolation structure (left-hand SAGE wall 1020) is between and in contact with the first gate structure and the second gate structure. A semiconductor fin/nanowire pair of the first plurality of semiconductor fins closest to the gate endcap isolation structure (from region 1070A) is spaced farther from the gate endcap isolation structure than a semiconductor fin/nanowire pair of the second plurality of semiconductor fins closest to the gate endcap isolation structure (from region 1070B).

In an embodiment, region 1070A is an I/O region, and region 1070B is a logic region. As depicted, in one such embodiment, a second logic region 1070C is adjacent the logic region 1070B, and is electrically connected to the logic region 1070B by a local interconnect 1054. Another region 1070D may be a location where an addition logic or I/O region may be placed. Embodiments described herein may involve differential spacing from a SAGE wall (e.g., a wider spacing from SAGE walls 1021B and left-hand 1020 in region 1070A), or may involve SAGE walls of differing width (e.g., narrower 1021B versus 1020 versus wider 1021A), or both differential spacing from a SAGE wall and SAGE walls of differing width. In an embodiment, I/O regions have a greater spacing between SAGE walls than a logic region. In an embodiment, a wider SAGE wall is between adjacent logic regions than is between adjacent I/O regions.

A gate contact 1014, and overlying gate contact via 1016 are also seen from this perspective, along with an overlying metal interconnect 1060, all of which are in inter-layer dielectric stacks or layers 1070. Also seen from the perspective of FIG. 10A, the gate contact 1014 is, in one embodiment, over the non-planar active regions. As is also depicted in FIG. 10A, an interface 1080 exists between a doping profile of protruding fin portions 1004 and sub-fin regions 1005, although other embodiments do not include such an interface in doping profile between these regions.

Referring to FIGS. 10A and 10B, the gate structures 1008 are shown as over the protruding fin portions 1004 and corresponding nanowires 1007, as isolated by self-aligned gate endcap isolation structures 1020. In an embodiment, the gate structures 1008 form one line of a plurality of parallel gate lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, grating-like gate patterns may have lines spaced at a constant pitch and having a constant width. The pattern may be fabricated by a pitch halving or pitch quartering, or other pitch division, approach.

Referring again to FIG. 10B, source and drain regions 1004A and 1004B of the protruding fin portions 1004 and corresponding nanowire(s) 1007 are shown in this perspective, although it is to be appreciated that these regions would be overlapped by trench contact structures. In one embodiment, the source and drain regions 1004A and 1004B are formed by a process such as described in association with FIGS. 6A-6C, and may have a structure such as the structures described in association with FIG. 6C, 7A or 7B. In an embodiment, the source and drain regions 1004A and 1004B extend below the height of trench isolation layer 1006, i.e., into the sub-fin region 1005. In an embodiment, the source and drain regions 1004A and 1004B have an uppermost surface below an uppermost surface of gate endcap isolation structures 1020.

In an embodiment, the integrated circuit structure 1000 includes non-planar devices such as, but not limited to, a finFET or a tri-gate device with corresponding one or more overlying nanowire structures. In such an embodiment, a corresponding semiconducting channel region is composed of or is formed in a three-dimensional body with one or more discrete nanowire channel portions overlying the three-dimensional body. In one such embodiment, the gate structures 1008 surround at least a top surface and a pair of sidewalls of the three-dimensional body, and further surrounds each of the one or more discrete nanowire channel portions.

Substrate 1002 may be composed of a semiconductor material that can withstand a manufacturing process and in which charge can migrate. In an embodiment, substrate 1002 is a bulk substrate composed of a crystalline silicon, silicon/germanium or germanium layer doped with a charge carrier, such as but not limited to phosphorus, arsenic, boron or a combination thereof, to form active region 1004. In one embodiment, the concentration of silicon atoms in bulk substrate 1002 is greater than 97%. In another embodiment, bulk substrate 1002 is composed of an epitaxial layer grown atop a distinct crystalline substrate, e.g. a silicon epitaxial layer grown atop a boron-doped bulk silicon mono-crystalline substrate. Bulk substrate 1002 may alternatively be composed of a group III-V material. In an embodiment, bulk substrate 1002 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 1002 is composed of a III-V material and the charge-carrier dopant impurity atoms are ones such as, but not limited to, carbon, silicon, germanium, oxygen, sulfur, selenium or tellurium.

Trench isolation layer 1006 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the trench isolation layer 1006 is composed of a dielectric material such as, but not limited to, silicon dioxide, silicon oxy-nitride, silicon nitride, or carbon-doped silicon nitride.

Self-aligned gate endcap isolation structures 1020, 1021A and 1021B may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide.

Gate structures 1008 may be composed of a gate electrode stack which includes a gate dielectric layer 1052 and a gate electrode layer 1050. In an embodiment, the gate electrode of the gate electrode stack is composed of a metal gate and the gate dielectric layer includes a high-K material.

In an exemplary embodiment, the gate structure 1008 of region 1070A includes a first gate dielectric 1052 conformal with the first plurality of semiconductor fin/nanowire pairs and laterally adjacent to and in contact with a first side of the gate endcap isolation structure (left-hand 1020). The second gate stack of region 1070B includes a second gate dielectric 1052 conformal with the second plurality of semiconductor fin/nanowire pairs and laterally adjacent to and in contact with a second side of the gate endcap isolation structure opposite the first side of the gate endcap isolation structure. In one embodiment, the first gate dielectric is thicker than the second gate dielectric, as is depicted in FIG. 10A. In one embodiment, the first gate dielectric has more dielectric layers (e.g., layers 1052A and 1052B) than the second gate dielectric (e.g., only layer 1052). In an embodiment, the gate dielectric of region 1070A is an I/O gate dielectric, and the gate dielectric of region 1070B is a logic gate dielectric.

In an embodiment, the gate dielectric of region 1070B is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 1002. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In an embodiment, the top high-k portion consists of a "U"-shaped structure that includes a bottom portion substantially parallel to the surface of the substrate and two sidewall portions that are substantially perpendicular to the top surface of the substrate. In an embodiment, the gate dielectric of region 1070A includes a layer of non-native silicon oxide in addition to a layer of high-k material. The layer of non-native silicon oxide may be formed using a CVD process and may be formed below or above the layer of high-k material. In an exemplary embodiment, the layer of non-native silicon oxide (e.g., layer 1052A) is formed below a layer of high-k material (e.g., layer 1052B).

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Local interconnect 1054, gate contact 1014, overlying gate contact via 1016, and overlying metal interconnect 1060 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material). A common example is the use of copper structures that may or may not include barrier layers (such as Ta or TaN layers) between the copper and surrounding ILD material. As used herein, the term metal includes alloys, stacks, and other combinations of multiple metals. For example, the metal interconnect lines may include barrier layers, stacks of different metals or alloys, etc.

In an embodiment (although not shown), providing structure 1000 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate structures 1008 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 1000. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 10A, in an embodiment, as depicted, an integrated circuit structure has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for integrated circuit structure or semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be appreciated that, as exemplified in FIGS. 10A and 10B, SAGE walls of varying width may be fabricated. It is also to be appreciated that fabrication of gate endcap isolation structures may lead to formation of a vertical seam within the gate endcap isolation structures. It is also to be appreciated that a stack of dielectric layers may be used to form a SAGE wall. It is also to be appreciated that gate endcap isolation structures may differ in composition depending on the spacing of adjacent fins.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers maybe formed by CVD, PVD, or by other deposition methods.

In an embodiment, as is also used throughout the present description, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an antireflective coating (ARC) layer, and a photoresist layer. In a particular such embodiment, the topographic masking portion is a carbon hardmask (CHM) layer and the antireflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 11:
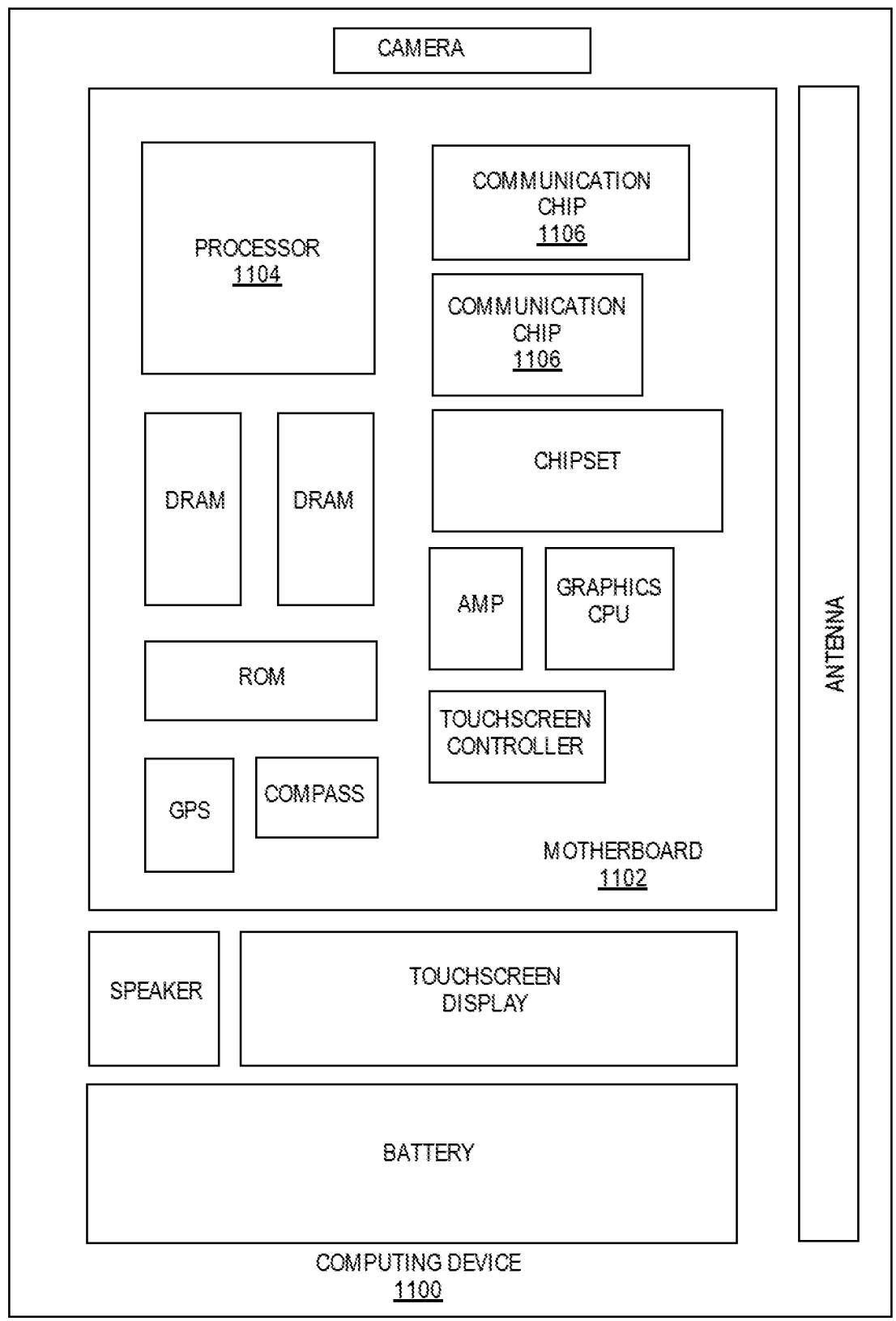
FIG. 11 illustrates a computing device in accordance with one implementation of an embodiment of the disclosure.

FIG. 11 illustrates a computing device 1100 in accordance with one implementation of an embodiment of the present disclosure. The computing device 1100 houses a board 1102. The board 1102 may include a number of components, including but not limited to a processor 1104 and at least one communication chip 1106. The processor 1104 is physically and electrically coupled to the board 1102. In some implementations the at least one communication chip 1106 is also physically and electrically coupled to the board 1102. In further implementations, the communication chip 1106 is part of the processor 1104.

Depending on its applications, computing device 1100 may include other components that may or may not be physically and electrically coupled to the board 1102. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1106 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing device 1100 includes an integrated circuit die packaged within the processor 1104. The integrated circuit die of the processor 1104 may include one or more structures, such as self-aligned gate endcap (SAGE) structures built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 1106 also includes an integrated circuit die packaged within the communication chip 1106. The integrated circuit die of the communication chip 1106 may include one or more structures, such as self-aligned gate endcap (SAGE) structures built in accordance with implementations of embodiments of the present disclosure.

In further implementations, another component housed within the computing device 1100 may contain an integrated circuit die that includes one or structures, such as self-aligned gate endcap (SAGE) structures built in accordance with implementations of embodiments of the present disclosure.

In various implementations, the computing device 1100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

Figure 12:
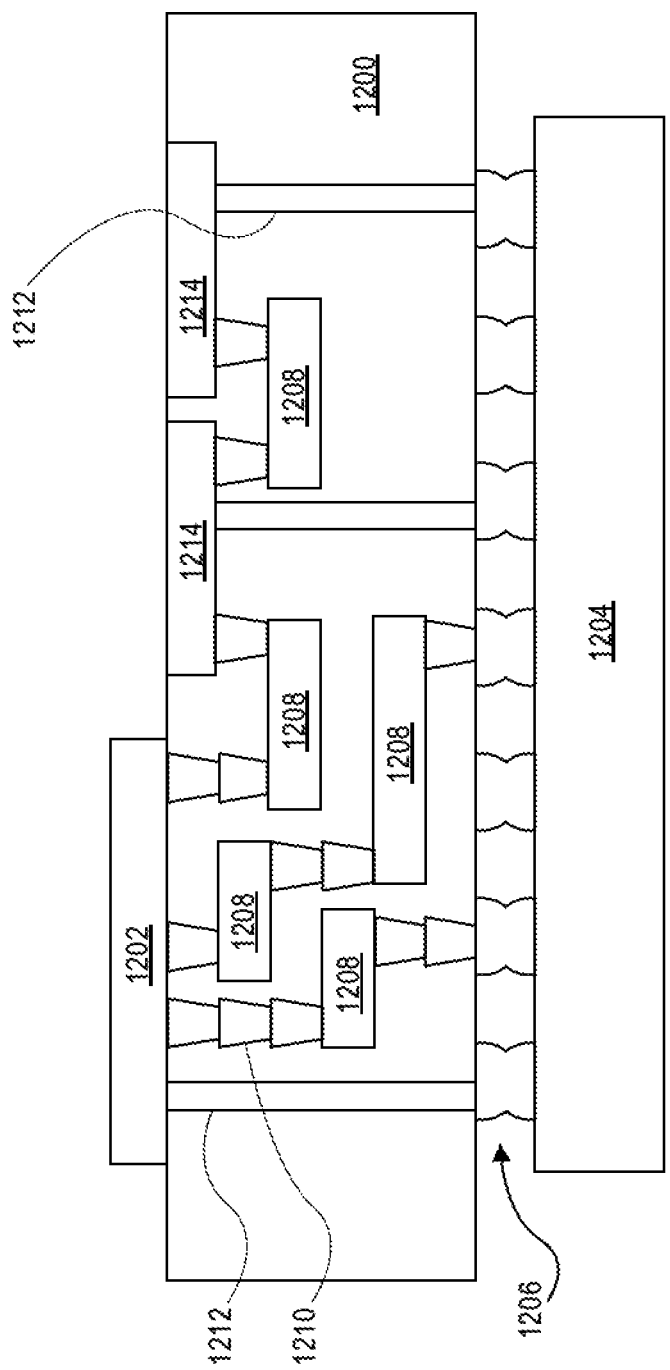
FIG. 12 illustrates an interposer that includes one or more embodiments of the disclosure.

FIG. 12 illustrates an interposer 1200 that includes one or more embodiments of the present disclosure. The interposer 1200 is an intervening substrate used to bridge a first substrate 1202 to a second substrate 1204. The first substrate 1202 may be, for instance, an integrated circuit die. The second substrate 1204 may be, for instance, a memory module, a computer motherboard, or another integrated circuit die. Generally, the purpose of an interposer 1200 is to spread a connection to a wider pitch or to reroute a connection to a different connection. For example, an interposer 1200 may couple an integrated circuit die to a ball grid array (BGA) 1206 that can subsequently be coupled to the second substrate 1204. In some embodiments, the first and second substrates 1202/1204 are attached to opposing sides of the interposer 1200. In other embodiments, the first and second substrates 1202/1204 are attached to the same side of the interposer 1200. And in further embodiments, three or more substrates are interconnected by way of the interposer 1200.

The interposer 1200 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1208 and vias 1210, including but not limited to through-silicon vias (TSVs) 1212. The interposer 1200 may further include embedded devices 1214, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1200. In accordance with embodiments of the disclosure, apparatuses or processes disclosed herein may be used in the fabrication of interposer 1200 or in the fabrication of components included in the interposer 1200.

Thus, embodiments of the present disclosure include self-aligned gate endcap (SAGE) architectures with gate-all-around devices having epitaxial source or drain structures, and methods of fabricating self-aligned gate endcap (SAGE) architectures with gate-all-around devices having epitaxial source or drain structures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure includes a first vertical arrangement of nanowires and a second vertical arrangement of nanowires above a substrate, the nanowires of the second vertical arrangement of nanowires having a horizontal width greater than a horizontal width of the nanowires of the first vertical arrangement of nanowires. A first gate stack is over the first vertical arrangement of nanowires. A second gate stack is over the second vertical arrangement of nanowires. A gate endcap isolation structure is between and in contact with the first gate stack and the second gate stack. First epitaxial source or drain structures are at ends of the first vertical arrangement of nanowires, the first epitaxial source or drain structures having an uppermost surface below an uppermost surface of the gate endcap isolation structure. Second epitaxial source or drain structures are at ends of the second vertical arrangement of nanowires, the second epitaxial source or drain structures having an uppermost surface below the uppermost surface of the gate endcap isolation structure.

Example Embodiment 2

The integrated circuit structure of example embodiment 1, wherein the uppermost surface of the first epitaxial source or drain structures is a first flat surface, and the uppermost surface of the second epitaxial source or drain structures is a second flat surface.

Example Embodiment 3

The integrated circuit structure of example embodiment 2, wherein the first flat surface of the first epitaxial source or drain structures is narrower than a widest width of the first epitaxial source or drain structures, and the second flat surface of the second epitaxial source or drain structures is narrower than a widest width of the second epitaxial source or drain structures.

Example Embodiment 4

The integrated circuit structure of example embodiment 2, wherein the first flat surface of the first epitaxial source or drain structures is narrower than a widest width of the first epitaxial source or drain structures, and the second flat surface of the second epitaxial source or drain structures is as wide as a widest width of the second epitaxial source or drain structures.

Example Embodiment 5

The integrated circuit structure of example embodiment 1, wherein the uppermost surface of the first epitaxial source or drain structures is a point, and the uppermost surface of the second epitaxial source or drain structures is a flat surface.

Example Embodiment 6

The integrated circuit structure of example embodiment 5, wherein the flat surface of the second epitaxial source or drain structures is narrower than a widest width of the second epitaxial source or drain structures.

Example Embodiment 7

The integrated circuit structure of example embodiment 1, 2, 3, 4, 5 or 6, wherein the first gate stack has dielectric sidewall spacers, and the first epitaxial source or drain structures are first embedded epitaxial source or drain structures extending beneath the dielectric sidewalls spacers of the first gate stack, and wherein the second gate stack has dielectric sidewall spacers, and the second epitaxial source or drain structures are second embedded epitaxial source or drain structures extending beneath the dielectric sidewalls spacers of the second gate stack.

Example Embodiment 8

The integrated circuit structure of example embodiment 1, 2, 3, 4, 5, 6 or 7, wherein a bottom portion of the first epitaxial source or drain structures is tapered, and a bottom portion of the second epitaxial source or drain structures is tapered.

Example Embodiment 9

The integrated circuit structure of example embodiment 1, 2, 3, 4, 5, 6, 7 or 8, wherein the first and second epitaxial source or drain structures are non-discrete first and second epitaxial source or drain structures.

Example Embodiment 10

The integrated circuit structure of example embodiment 1, 2, 3, 4, 5, 6, 7, 8 or 9, wherein the first vertical arrangement of nanowires is over a first fin, and the second vertical arrangement of nanowires is over a second fin.

Example Embodiment 11

The integrated circuit structure of example embodiment 1, 2, 3, 4, 5, 6, 7, 8, 9 or 10, wherein the first and second gate stacks each comprise a high-k gate dielectric layer and a metal gate electrode.

Example Embodiment 12

A method of fabricating an integrated circuit structure includes forming a first vertical arrangement of nanowires and a second vertical arrangement of nanowires above a substrate, the nanowires of the second vertical arrangement of nanowires having a horizontal width greater than a horizontal width of the nanowires of the first vertical arrangement of nanowires. A gate endcap isolation structure is formed between the first vertical arrangement of nanowires and the second vertical arrangement of nanowires. First epitaxial source or drain structures are formed at ends of the first vertical arrangement of nanowires. Second epitaxial source or drain structures are formed at ends of the second vertical arrangement of nanowires, the second epitaxial source or drain structures having an uppermost surface above the uppermost surface of the gate endcap isolation structure. The uppermost surface of the second epitaxial source or drain structures are recessed below the uppermost surface of the gate endcap isolation structure.

Example Embodiment 13

The method of example embodiment 12, wherein recessing the uppermost surface of the second epitaxial source or drain structures further comprises recessing an uppermost surface of the first epitaxial source or drain structures.

Example Embodiment 14

The method of example embodiment 12, wherein recessing the uppermost surface of the second epitaxial source or drain structures does not comprise recessing an uppermost surface of the first epitaxial source or drain structures.

Example Embodiment 15

The method of example embodiment 12, 13 or 14, wherein recessing the uppermost surface of the second epitaxial source or drain structures comprises recessing from a point of the second epitaxial source or drain structures to an uppermost flat surface.

Example Embodiment 16

The method of example embodiment 12, 13, 14 or 15, wherein the first vertical arrangement of nanowires is over a first fin, and the second vertical arrangement of nanowires is over a second fin.

Example Embodiment 17

An integrated circuit structure includes a first fin having a longest dimension along a first direction. A first nanowire is over the first fin. A second fin having a longest dimension is along the first direction. A second nanowire is over the second fin. The second nanowire is wider than the nanowire. A first gate structure is over the first nanowire and the first fin, the first gate structure having a longest dimension along a second direction, the second direction orthogonal to the first direction. A second gate structure is over the second nanowire and over the second fin, the second gate structure having a longest dimension along the second direction, the second gate structure discontinuous with the first gate structure along the second direction, and the second gate structure having an edge facing an edge of the first gate structure along the second direction. A gate endcap isolation structure is between and in contact with the edge of the first gate structure and the edge of the second gate structure along the second direction, the gate endcap isolation structure having a length along the first direction greater than a length of the first gate structure and the second gate structure along the first direction. First epitaxial source or drain structures are at ends of the first nanowire, the first epitaxial source or drain structures having an uppermost surface below an uppermost surface of the gate endcap isolation structure. Second epitaxial source or drain structures are at ends of the second nanowire, the second epitaxial source or drain structures having an uppermost surface below the uppermost surface of the gate endcap isolation structure.

Example Embodiment 18

The integrated circuit structure of example embodiment 17, further including first dielectric sidewall spacers along the first gate structure, the first epitaxial source or drain structures extending beneath the first dielectric sidewalls spacers, and further including second dielectric sidewall spacers along the second gate structure, the second epitaxial source or drain structures extending beneath the second dielectric sidewalls spacers.

Example Embodiment 19

The integrated circuit structure of example embodiment 17 or 18, wherein the gate endcap isolation structure has a height greater than a height of the first gate structure and greater than a height of the second gate structure.

Example Embodiment 20

The integrated circuit structure of example embodiment 19, further including a local interconnect over a portion of the first gate structure, over a portion of the gate endcap isolation structure, and over a portion of the second gate structure.

What is claimed is:

1. An integrated circuit structure, comprising:
   a first vertical arrangement of nanowires and a second vertical arrangement of nanowires above a substrate, the nanowires of the second vertical arrangement of nanowires having a horizontal width greater than a horizontal width of the nanowires of the first vertical arrangement of nanowires;
   a first gate stack over the first vertical arrangement of nanowires;
   a second gate stack over the second vertical arrangement of nanowires;
   a gate endcap isolation structure between and in contact with the first gate stack and the second gate stack;
   first epitaxial source or drain structures at ends of the first vertical arrangement of nanowires, the first epitaxial source or drain structures having an uppermost surface below an uppermost surface of the gate endcap isolation structure; and
   second epitaxial source or drain structures at ends of the second vertical arrangement of nanowires, the second epitaxial source or drain structures having an uppermost surface below the uppermost surface of the gate endcap isolation structure.

2. The integrated circuit structure of claim 1, wherein the uppermost surface of the first epitaxial source or drain structures is a first flat surface, and the uppermost surface of the second epitaxial source or drain structures is a second flat surface.

3. The integrated circuit structure of claim 2, wherein the first flat surface of the first epitaxial source or drain structures is narrower than a widest width of the first epitaxial source or drain structures, and the second flat surface of the second epitaxial source or drain structures is narrower than a widest width of the second epitaxial source or drain structures.

4. The integrated circuit structure of claim 2, wherein the first flat surface of the first epitaxial source or drain structures is narrower than a widest width of the first epitaxial source or drain structures, and the second flat surface of the second epitaxial source or drain structures is as wide as a widest width of the second epitaxial source or drain structures.

5. The integrated circuit structure of claim 1, wherein the uppermost surface of the first epitaxial source or drain structures is a point, and the uppermost surface of the second epitaxial source or drain structures is a flat surface.

6. The integrated circuit structure of claim 5, wherein the flat surface of the second epitaxial source or drain structures is narrower than a widest width of the second epitaxial source or drain structures.

7. The integrated circuit structure of claim 1, wherein the first gate stack has dielectric sidewall spacers, and the first epitaxial source or drain structures are first embedded epitaxial source or drain structures extending beneath the dielectric sidewalls spacers of the first gate stack, and wherein the second gate stack has dielectric sidewall spacers, and the second epitaxial source or drain structures are second embedded epitaxial source or drain structures extending beneath the dielectric sidewalls spacers of the second gate stack.

8. The integrated circuit structure of claim 1, wherein a bottom portion of the first epitaxial source or drain structures is tapered, and a bottom portion of the second epitaxial source or drain structures is tapered.

9. The integrated circuit structure of claim 1, wherein the first and second epitaxial source or drain structures are non-discrete first and second epitaxial source or drain structures.

10. The integrated circuit structure of claim 1, wherein the first vertical arrangement of nanowires is over a first fin, and the second vertical arrangement of nanowires is over a second fin.

11. The integrated circuit structure of claim 1, wherein the first and second gate stacks each comprise a high-k gate dielectric layer and a metal gate electrode.

12. An integrated circuit structure, comprising:
    a first fin having a longest dimension along a first direction;
    a first nanowire over the first fin;
    a second fin having a longest dimension along the first direction;
    a second nanowire over the second fin, wherein the second nanowire is wider than the nanowire;
    a first gate structure over the first nanowire and the first fin, the first gate structure having a longest dimension along a second direction, the second direction orthogonal to the first direction;
    a second gate structure over the second nanowire and over the second fin, the second gate structure having a longest dimension along the second direction, the second gate structure discontinuous with the first gate structure along the second direction, and the second gate structure having an edge facing an edge of the first gate structure along the second direction;
    a gate endcap isolation structure between and in contact with the edge of the first gate structure and the edge of the second gate structure along the second direction, the gate endcap isolation structure having a length along the first direction greater than a length of the first gate structure and the second gate structure along the first direction;
    first epitaxial source or drain structures at ends of the first nanowire, the first epitaxial source or drain structures having an uppermost surface below an uppermost surface of the gate endcap isolation structure; and
    second epitaxial source or drain structures at ends of the second nanowire, the second epitaxial source or drain structures having an uppermost surface below the uppermost surface of the gate endcap isolation structure.

13. The integrated circuit structure of claim 12, further comprising:
    first dielectric sidewall spacers along the first gate structure, the first epitaxial source or drain structures extending beneath the first dielectric sidewalls spacers; and
    second dielectric sidewall spacers along the second gate structure, the second epitaxial source or drain structures extending beneath the second dielectric sidewalls spacers.

14. The integrated circuit structure of claim 12, wherein the gate endcap isolation structure has a height greater than a height of the first gate structure and greater than a height of the second gate structure.

15. The integrated circuit structure of claim 14, further comprising:
    a local interconnect over a portion of the first gate structure, over a portion of the gate endcap isolation structure, and over a portion of the second gate structure.

* * * * *